United States Patent [19]
Whetsel

[11] Patent Number: 5,847,561
[45] Date of Patent: Dec. 8, 1998

[54] LOW OVERHEAD INPUT AND OUTPUT BOUNDARY SCAN CELLS

[75] Inventor: Lee D. Whetsel, Plano, Tex.

[73] Assignee: Texas Instruments Incorporated, Dallas, Tex.

[21] Appl. No.: 839,532

[22] Filed: Apr. 14, 1997

Related U.S. Application Data

[63] Continuation of Ser. No. 509,405, Jul. 31, 1995, abandoned, which is a continuation-in-part of Ser. No. 358,128, Dec. 16, 1994, abandoned.

[51] Int. Cl.$^6$ .................................................. G01R 31/28
[52] U.S. Cl. .................. 324/158.1; 324/763; 371/22.32; 371/22.5
[58] Field of Search ................................ 324/158.1, 763; 371/21.1, 22.32, 22.5, 22.6, 25.1

[56] References Cited

U.S. PATENT DOCUMENTS

| | | | |
|---|---|---|---|
| 3,789,205 | 1/1974 | James ....................................... | 371/22.1 |
| 3,961,251 | 6/1976 | Hurley et al. ............................ | 371/21.1 |
| 3,961,252 | 6/1976 | Eichelberger ........................... | 371/21.1 |
| 3,961,254 | 6/1976 | Cavaliere et al. ...................... | 371/22.3 |
| 4,357,703 | 11/1982 | Van Brunt ................................ | 324/537 |
| 4,698,588 | 10/1987 | Hwang et al. ........................... | 324/158.1 |
| 4,875,003 | 10/1989 | Burke ....................................... | 371/25.1 |
| 5,115,191 | 5/1992 | Yoshimori ............................... | 371/22.3 |
| 5,134,314 | 7/1992 | Wehrmacher ........................... | 324/158.1 |
| 5,254,940 | 10/1993 | Oke et al. ................................ | 371/22.5 |
| 5,270,642 | 12/1993 | Parker ...................................... | 371/22.3 |
| 5,303,246 | 4/1994 | Anderson et al. ...................... | 371/22.3 |
| 5,329,167 | 7/1994 | Farwell .................................... | 371/22.3 |
| 5,457,381 | 10/1995 | Farwell .................................... | 324/763 |
| 5,473,617 | 12/1995 | Farwell .................................... | 371/22.3 |

FOREIGN PATENT DOCUMENTS

| | | |
|---|---|---|
| 0 522 413 A2 | 1/1993 | European Pat. Off. . |
| 2 266 965 A | 11/1993 | United Kingdom . |

OTHER PUBLICATIONS

L. Whetsel, "IEEE STD. 1149.1 –An Introduction", NEPCON, Feb. 1993, 10 pages.

Dilip K. Bhavsar, "Chapter 17. Cell Designs that Help Test Interconnect Shorts," IEEE, month unavailable 1990, pp. 183–189.

Nati–Chin Lee, "A Hierarchical Analog Test Bus Framework for Testing Mixed–Signal Integrated Circuits and Printed Circuit Boards", Journal of Electronic Testing, vol. 4, No. 4, Nov. 1, 1993, pp. 361–368.

*Primary Examiner*—Ernest F. Karlsen
*Attorney, Agent, or Firm*—Lawrence J. Bassuk; Christopher L. Maginniss; Richard L. Donaldson

[57] ABSTRACT

An integrated circuit includes functional circuitry for performing normal operating functions of the integrated circuit, an output terminal which is accessible externally of the integrated circuit, and an output drive circuit (OB,OA) for receiving an output signal from the functional circuitry and driving the output signal to the output terminal. A switch (TG1,S1) is provided for selectively isolating the output terminal from the functional circuitry, and the switch is connected between the functional circuitry and the output drive circuit.

24 Claims, 14 Drawing Sheets

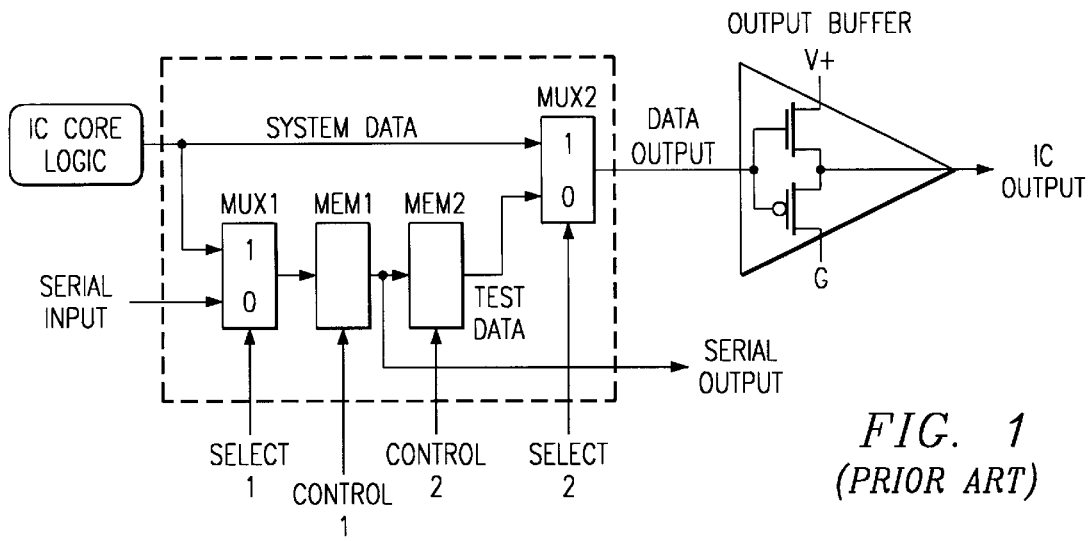
FIG. 1
(PRIOR ART)
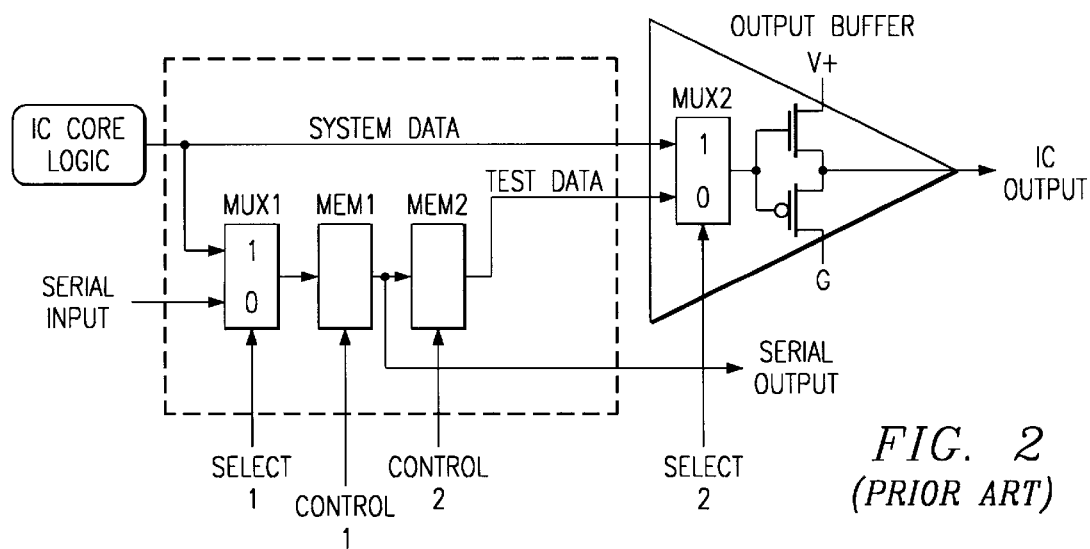
FIG. 1A
(PRIOR ART)
FIG. 2
(PRIOR ART)

| OPERATION | SAMPLE | EXTEST | INTEST |
|---|---|---|---|
| SELECT 1  | 0 1 0 0 0 0 0 0 0 | 0 1 0 0 0 0 0 0 0 | 0 1 0 0 0 0 0 0 0 |
| CONTROL 1 | 0 C C C C C C 0 0 | 0 C C C C C C 0 0 | 0 C C C C C C 0 0 |
| CONTROL 2 | 0 0 0 0 0 0 0 C 0 | 0 0 0 0 0 0 0 C 0 | 0 0 0 0 0 0 0 C 0 |
| SELECT 2  | 1 1 1 1 1 1 1 1 1 | 0 0 0 0 0 0 0 0 0 | 0 0 0 0 0 0 0 0 0 |
| SELECT 3  | 0 0 0 0 0 0 0 0 0 | 1 1 1 1 1 1 1 1 1 | 0 0 0 0 0 0 0 0 0 |

→ TIME

| OPERATION | EXTEST1 | EXTEST2 | EXTEST3 |
|---|---|---|---|
| SELECT 1  | 0 1 0 0 0 0 0 0 0 | 0 1 0 0 | 0 1 0 0 0 0 0 0 0 |
| CONTROL 1 | 0 C C C C C C 0 0 | 0 C 0 0 | 0 C C C C C C 0 0 |
| CONTROL 2 | 0 0 0 0 0 0 0 C 0 | 0 0 C 0 | 0 0 0 0 0 0 0 C 0 |
| SELECT 2  | 0 0 0 0 0 0 0 0 0 | 0 0 0 0 | 0 0 0 0 0 0 0 0 0 |
| SELECT 3  | 1 1 1 1 1 1 1 1 1 | 1 1 1 1 | 1 1 1 1 1 1 1 1 1 |

→ TIME

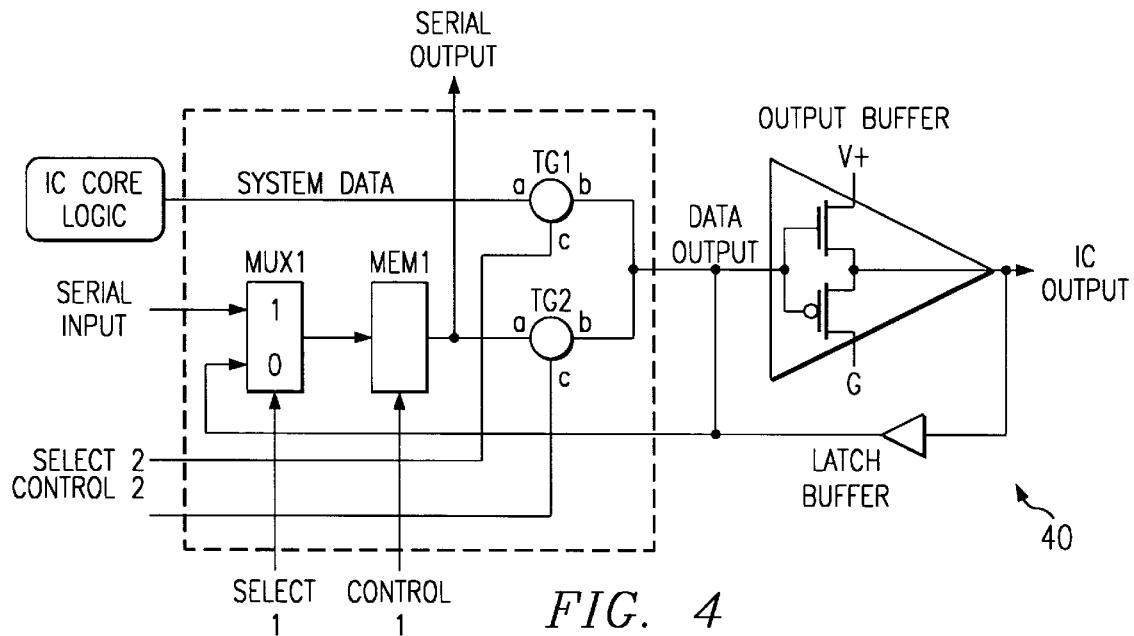
FIG. 4
| OPERATION | SAMPLE | EXTEST |
|---|---|---|
| SELECT 1  | 0 1 0 0 0 0 0 0 0 0 | 0 1 0 0 0 0 0 0 0 0 |
| CONTROL 1 | 0 C C C C C C C 0 0 | 0 C C C C C C C 0 0 |
| CONTROL 2 | 0 0 0 0 0 0 0 0 0 0 | 0 0 0 0 0 0 0 0 C 0 |
| SELECT 2  | 1 1 1 1 1 1 1 1 1 1 | 0 0 0 0 0 0 0 0 0 0 |
→ TIME
FIG. 4A
| OPERATION | EXTEST |
|---|---|
| SELECT 1  | 0 1 0 0 0 0 0 0 0 |
| CONTROL 1 | 0 C C C C C C C 0 0 |
| CONTROL 2 | 1 0 0 0 0 0 0 0 1 1 |
| SELECT 2  | 0 0 0 0 0 0 0 0 0 |
→ TIME
FIG. 4B
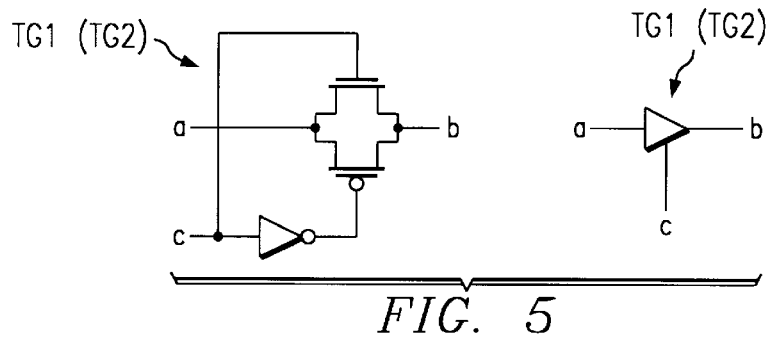
FIG. 5

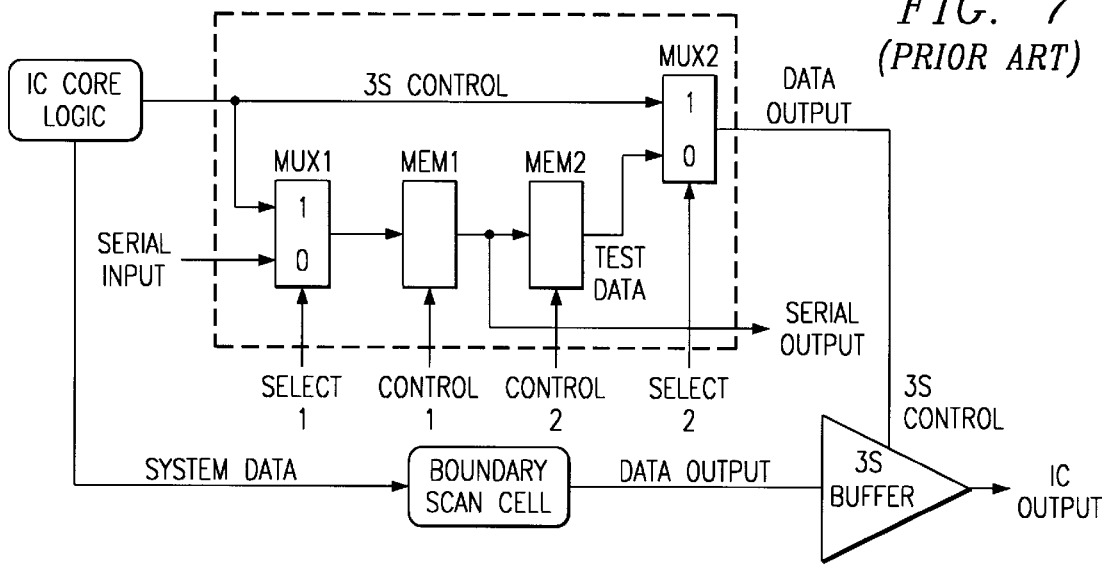
FIG. 6B
FIG. 7 (PRIOR ART)
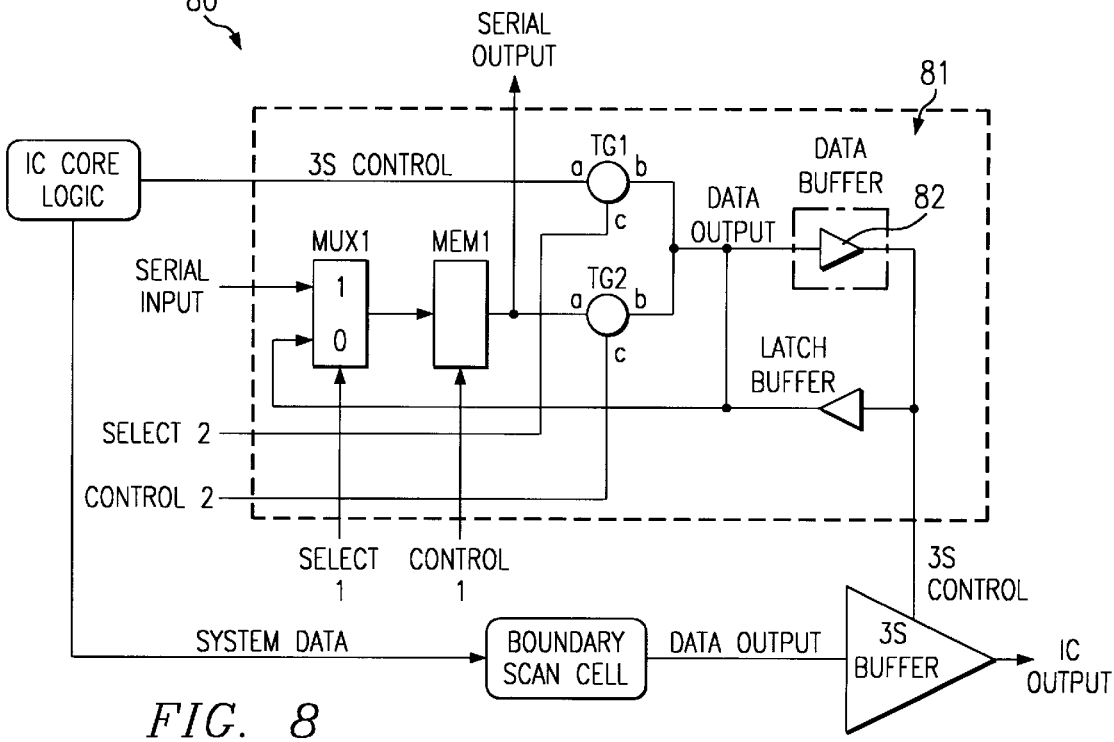
FIG. 8

LOW OVERHEAD INPUT AND OUTPUT BOUNDARY SCAN CELLS

This application is a Continuation, of application Ser. No. 08/509,405 filed on Jul. 31, 1995 of Lee D. Whetsel for Low Overhead Input and Output Boundary Scan Cells, now abandoned, which is a continuation-in-part of U.S. Ser. No. 08/358,128 filed on Dec. 16, 1994, now abandoned.

TECHNICAL FIELD OF THE INVENTION

The invention relates to integrated circuits (ICs) and, more particularly, to boundary scan cells implemented at input and output pins of ICs to simplify testing of the ICs and their wiring interconnections.

BACKGROUND OF THE INVENTION

Boundary scan testing is very well known in the art and is supported by an IEEE standard (IEEE 1149.1) which details its implementation and operation modes. FIG. 1 illustrates the logic arrangement of a prior art boundary scan cell for use in boundary scan testing at IC outputs. The boundary scan cell contains an input multiplexer (Mux1), a capture/shift memory (Mem1) such as a flip-flop or other latch circuit, an output memory (Mem2) such as a flip-flop or other latch circuit, and an output multiplexer (Mux2). Mux1 is controlled by a select signal (Select 1) to allow Mem1 to load data from either the serial data input or the system data output by the IC core logic. Mem1 loads data in response to a control signal (Control 1). The output of Mem1 is input to Mem2 and is output as serial data. Mem2 loads data from Mem1 in response to a control signal (Control 2). Mux2 is controlled by a select input (Select 2) to allow it to output to the IC's output buffer either the output of Mem2 or the system data from the IC core logic. A plurality of these boundary scan cells can be connected serially, via the serial input and output lines, to form a boundary scan register.

In FIG. 1, the output boundary scan cell logic is enclosed in dotted lines. The boundary scan cell connects an output from the IC's core logic to the IC's output buffer. The output buffer outputs a high (V+) or low (G) voltage in response to the logic level it receives from Mux2. The boundary scan cell is realized in the same region of the IC as the core logic, i.e., the core region. In most instances, i.e. when implemented in accordance with the rules stated in the IEEE 1149.1 standard, the boundary scan cell logic is dedicated for test purposes and is not shared with system logic functions. In this way, the boundary scan cell can be accessed for non-intrusive test operations without disturbing the IC's normal functional operation.

The IEEE 1149.1 standard defines three types of test operations for boundary scan cells, a sample test operation (Sample), an external test (Extest) and internal test (Intest). Sample is a required test mode for 1149.1. During Sample, the IC is in normal operation (i.e. IC's core logic is connected to the output buffers via Mux2) and Mux1 and Mem1 are operated to capture and shift out normal IC output data. Extest is another required test mode for 1149.1. During Extest, output boundary scan cells are used to drive test data from IC outputs onto wiring interconnects, and input boundary scan cells are used to capture the driven test data at IC inputs. In this way, Extest can be used to test wiring interconnects between IC inputs and outputs on a board. Intest is an optional test mode for 1149.1. During Intest, input boundary scan cells are used to drive test data to the IC's core logic, and output boundary scan cells are used to capture the response from the core logic. In this way, Intest can be used to test IC core logic.

During normal IC operation, the output of the IC's core logic passes through Mux2, to the output buffer, and is driven off the IC by the output buffer. Therefore, during normal mode, the IC output function is not effected by the boundary scan cell, except for the delay introduced by Mux2. If, during normal operation, a Sample is performed, the boundary scan cell receives Select 1 and Control 1 input to capture system data and shift it out for inspection via the serial output.

During test operation, the output of the ICs core logic is received by the boundary scan cell for capturing and shifting, but Mux2 is controlled by Select 2 to output the test data stored in Mem2 to the output buffer. Therefore, during test mode, the IC core logic output function is disabled by the boundary scan cell. If, during test operation, an Extest or Intest is performed, the boundary scan cell receives Select 1 and Control 1 inputs to capture system data into Mem1 and shift it out for inspection via the serial output. While Mem1 is capturing and shifting data, Mem2 outputs stable test data to the output pin. After Mem1 has completed its capture and shift operation in Extest it contains new test data to be loaded into Mem2. Mem2 loads the new test data from Mem1 in response to a signal on Control 2. After Mem2 receives the new test data, it is output from the IC via Mux2 and the output buffer. The purpose for Mem2 is to latch the IC's output at a desired test logic state while Mem1 is capturing and shifting data. Without Mem2, i.e. if the output of Mem1 were connected to Mux2 directly, the IC's output would transition between logic (i.e. ripple) states as data is captured into and shifted through Mem1.

Examples of the boundary scan cell of FIG. 1 performing Sample, Extest and Intest operations are illustrated in the timing diagram of FIG. 1A. In the timing diagram of FIG. 1A and all following timing diagrams, "C" indications on the Control 1 and Control 2 signals indicate a low-high-low signal sequence which, in the example circuits shown, provides the control to store data into Mem1 and Mem2, respectively. Logic zero and one levels on the Select 1 and Select 2 signals indicate logic levels used to control the operation of Mux1 and Mux2, respectively. Also, seven Control 1 "C" signals are used in all example timing diagrams. The first Control 1 "C" signal indicates the capture of data into Mem1, and the following six Control "C" signals represent the shifting of data through six serially connected boundary scan cell circuits.

In FIG. 2, a known improvement to the boundary scan cell of FIG. 1 is shown. The improvement is brought about by realizing Mux2 in the buffer region of the IC's output buffer. Relocating test logic in the IC buffer region frees up area in the IC's core logic for system (non-test) logic functions. The logic required in the IC's core region is reduced by the size of Mux2 for each required output boundary scan cell. This leaves only the boundary scan cell's Mux1, Mem1, and Mem2 as test logic overhead in the IC's core region. The amount of boundary scan cell logic that needs to be placed and routed in the IC's core region is reduced. The boundary scan cell of FIG. 2 operates exactly like the one of FIG. 1.

FIG. 3 illustrates another known improvement to the boundary scan cell of FIG. 1. This improvement was described in 1990 by D. Bhavsar on pages 183–189 of IEEE Society Press Publication "Cell Designs that Help Test Interconnection Shorts". The improvement allows the logic output from the output buffer to be captured and shifted out of Mem1 during Extest. This feature allows detecting shorts between pins or to supply voltages or ground that conflict with the logic level attempting to be driven out of the output buffer. For example, during Extest, if a logic one is driven from Mem2 the output buffer will attempt to drive out a logic one. However, if the output of the output buffer is shorted to ground a high current (or low impedance) path exists in the output buffer from V+ through the top transistor to ground, which can result in a damaged or destroyed output buffer. Similarly if Mem2 is driving out a logic zero and the output of the output buffer is shorted to a supply voltage, a high current (low impedance) path exists through the bottom transistor to ground (G), again resulting in a damaged or destroyed output buffer. The boundary scan cell of FIG. 3 allows detecting these short circuit conditions by the addition of a third multiplexer (Mux3), a third select input (Select 3), and an input buffer. The input buffer inputs the logic state at the output of the output buffer. Mux3 inputs the system data and the logic state of the output buffer, via the input buffer, and outputs a selected one of these signals to one input of Mux1. In this example, Mux3 selects the system logic if Select 3 is low (Intest) or the output buffer state if Select 3 is high (Extest). In this way, Mem1 captures and shifts system data from the IC's core logic during Sample and Intest, and test data from the input buffer during Extest.

Examples of the boundary scan cell of FIG. 3 in Sample, Extest, and Intest operation are illustrated in the timing diagram of FIG. 3A. The boundary scan cell of FIG. 3 also allows reducing the time that an output can be shorted. In the timing diagram of FIG. 3B, it is seen that after a full Extest operation, Extest 1 (i.e. the Capture & Shift of Mem1 and the Updating of Mem2), a short Extest operation, Extest 2 (i.e. the Capture Only of Mem1 (no shift) and Update of the captured data to Mem2), can be performed. The Extest 2 operation allows test data from the output to be updated into Mem2 to correct any voltage conflict on the output. For example, if the Extest 1 operation had attempted to output a logic one on the output buffer, with the IC output shorted to ground, and the Extest 2 operation captured and updated a logic zero (due to the short to ground), the amount of time the output buffer was in the high current situation (V+ to G through top transistor) is reduced to the number of TCK periods it takes to go from the update step of Extest 1 to the update step of Extest 2, TCK being, for example, the test clock of IEEE 1149.1. The next full Extest operation (Extest 3) captures and shifts out the logic zero to indicate the short to ground and the resulting change in state of Mem2, brought about by the short Extest operation (Extest 2). If no short to ground existed, then the Extest 2 operation would have reloaded Mem2 with the logic one from the Extest 1 operation, and the Extest 3 operation would have verified the logic one at the IC output.

While this approach reduces the amount of time a voltage conflict can exist at an IC output, the time it takes to execute the corrective Extest scan operations, i.e. Extest 1 to Extest 2 update times in FIG. 3B, may still endanger the output buffer. Also when the IC is first powered up in its normal mode, output conflicts due to shorts can exist for an extended amount of time before a test mode is entered, if entered at all. So while the boundary scan cell of FIG. 3 does provide short circuit detection and correction improvements over the one in FIG. 1, it requires time to make the corrections and does not provide protection at power up where the IC immediately enters its normal operation. Also the boundary scan cell of FIG. 3 requires an additional Mux3, Select 3 signal, and input buffer to achieve the short circuit detection and correction feature.

It is desirable in view of the foregoing to implement at least the functionality of the prior art boundary scan cells using less of the IC core area. To this end, the present invention: provides a boundary scan cell that requires less logic in the IC core region than prior art boundary scan cells; utilizes the IC output buffer as part of output boundary scan cells, and the IC input buffer as part of input boundary scan cells; provides latchable input and output buffer circuits that serve the function of Mem2 in the prior art boundary scan cells; integrates the functions of Mux2 and Mem2 into IC input and output buffers to facilitate boundary scan cell logic reduction in the IC core region; provides a boundary scan cell and output buffer combination that can immediately and asynchronously detect and correct short circuit conditions on output pins during Extest operation; provides a boundary scan cell and output buffer combination that can immediately and asynchronously detect and correct short circuit conditions on output pins when the IC is initially powered up in its normal mode; and provides an IC power up method and procedure that prevents IC output buffers from being damaged or destroyed by short circuits.

BRIEF DESCRIPTION OF THE DRAWINGS

FIGS. 1–3 illustrate prior art output boundary scan cell structures.

FIG. 1A includes three timing diagrams which illustrate three different test operations performed by the prior art output boundary scan cell structure of FIG. 1.

FIG. 3A includes three timing diagrams which illustrate three different test operations performed by the prior art output boundary scan cell structure of FIG. 3.

FIG. 3B includes three timing diagrams which illustrate a sequence of test operations performed by the prior art output boundary scan cell structure of FIG. 3 to detect and correct for short circuits at the IC output.

FIG. 4 illustrates an exemplary output boundary scan cell structure according to the present invention.

FIG. 4A includes two timing diagrams which illustrate two different test operations performed by the output boundary scan cell structure of FIG. 4.

FIG. 4B includes a timing diagram which illustrates another test operation performed by the output boundary scan cell structure of FIG. 4.

FIG. 5 illustrates exemplary circuitry for realizing the transmission gates of FIG. 4.

FIG. 6B includes two timing diagrams which illustrate two additional test operations performed by the output boundary scan cell structure of FIG. 6.

FIG. 7 illustrates a prior art output boundary scan cell structure for use with a three-state output.

FIG. 8 illustrates an exemplary output boundary scan cell structure according to the present invention for use with a three-state output.

DETAILED DESCRIPTION OF THE INVENTION

Figures 3, 3A, 3B:
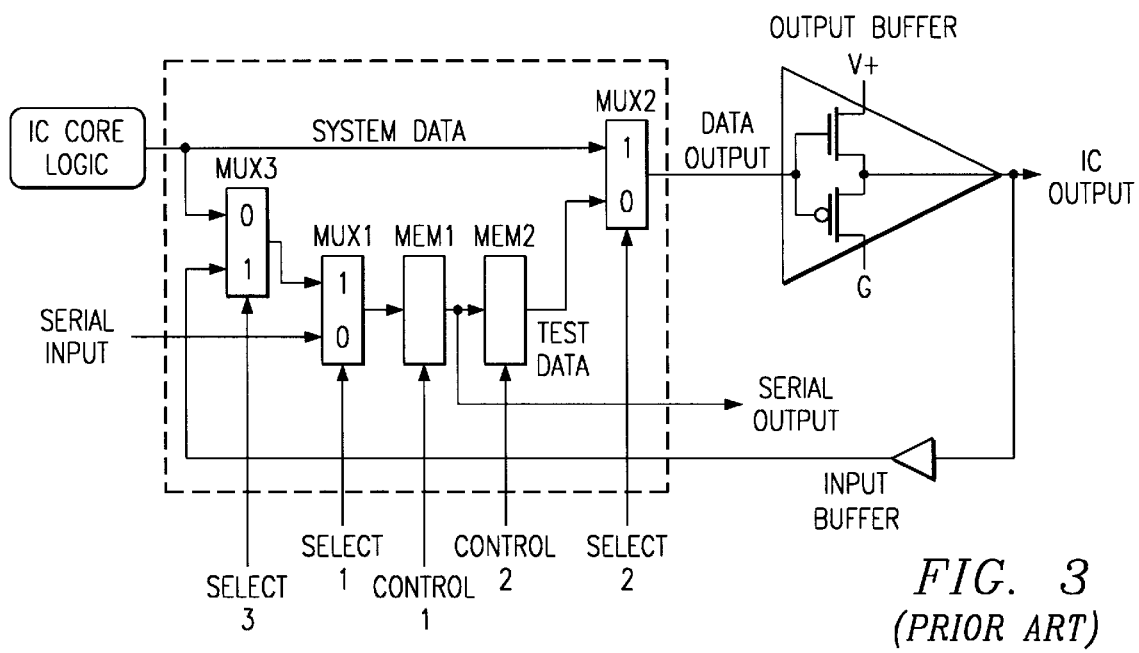
Figures 6, 6A:
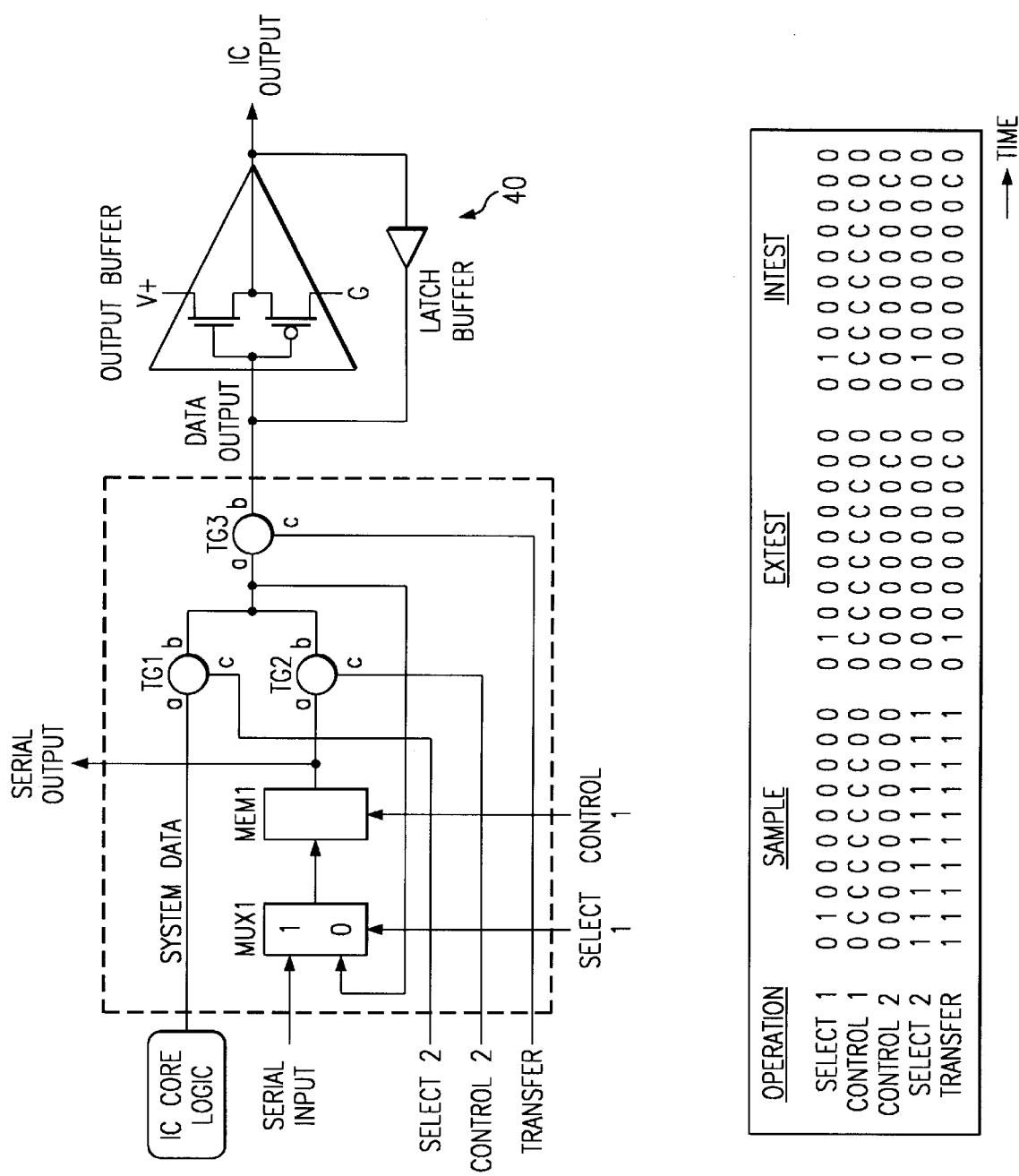
FIG. 6 illustrates another exemplary output boundary scan cell structure according to the present invention.
FIG. 6A includes three timing diagrams which illustrate three different test operations performed by the output boundary scan cell structure of FIG. 6.

FIGS. 4 and 6 illustrate exemplary output boundary scan cells according to the invention, containing all the features of the prior art output boundary scan cells of FIGS. 1–3 plus an improved short circuit detection and correction method, while requiring significantly less logic in the IC's core region. The boundary scan cells of FIGS. 4 and 6 provide the following improvements over prior art output boundary scan cells; (1) increased boundary scan cell functionality, (2) reduced boundary scan cell logic overhead, and (3) improved output buffer short circuit protection. The boundary scan cell of FIG. 4 is designed to perform only the required 1149.1 Sample and Extest operations, whereas the boundary scan cell of FIG. 6 is designed to perform the required Sample and Extest operations, as well as the optional Intest operation.

In FIG. 4, the boundary scan cell logic includes Mux1, Mem1, two transmission gates (TG1 and TG2), and a latch buffer. While transmission gates are used in FIG. 4, other signal transfer or switching elements could also be used, such as tristatable buffers. Examples of a transmission gate arrangement and a tristatable buffer that could serve as TG1 and TG2 are shown in FIG. 5. The Mem2 function of the prior art is realized by the combination of the IC output buffer, the latch buffer, and TG2. The Mem2 function and IC core logic thus share use of the IC output buffer. The Mux2 function of the prior art examples is realized by TG1 and TG2. The output of the IC output buffer is connected to the input of the latch buffer. The output of the latch buffer is connected to the input of the output buffer. In this arrangement, a latchable output buffer 40 is obtained when TG1 and TG2 are disabled. The latching operation is realized by the latch buffer feedback which allows the output of the output buffer to drive the input of the output buffer.

In normal operation of the IC, TG1 is enabled to pass system data to the input of the output buffer, and TG2 is disabled. In test operation of the IC, TG2 is enabled to pass test data from Mem1 to the input of the latchable output buffer 40 (which serves as Mem2), and TG1 is disabled. The latch buffer is designed with a weak enough output so that when TG1 or TG2 is enabled, either can overdrive the output of the latch buffer. However, when TG1 and TG2 are disabled, the output from the latch buffer is sufficient to maintain at the output buffer's input a logic level fed back from the IC output, thus providing a latching feature which performs the Mem2 function. If desired, one or both of TG1 and TG2 could be realized in the IC's output buffer region, to further reduce the amount of boundary scan cell logic in the IC's core region to as little as Mux1 and Mem1. The positions of the Mux2 and Mem2 functions are reversed in FIG. 4 as compared to the prior art examples in FIGS. 1–3, i.e. the Mem2 function (TG2, latch buffer, and output buffer) appears after the Mux2 function (TG1 and TG2).

During Sample operation, the IC is in normal mode wherein Select 2 enables TG1 and Control 2 disables TG2. The Control 2 signal is not active during normal operation and remains low to disable TG2. One way of keeping Control 2 inactive would be to gate it off with the Select 2 signal during normal operation. In normal operation mode, the output of the IC's core logic (system data) passes through TG1 to be input to the latchable output buffer 40 and driven off the IC. Therefore, during normal operation, the IC output function is not affected by the boundary scan cell, except for the delay introduced by TG1. During Sample, the boundary scan cell receives Select 1 and Control 1 input to first capture into Mem1 the system data output from TG1 to Mux 1, and then shift the captured data out for inspection via the serial output. The prior art cells capture system data entering Mux2 during Sample, whereas the boundary scan cell of FIG. 4 captures system data leaving TG1. An example of the boundary scan cell in Sample operation is illustrated in the limiting diagram of FIG. 4A. This timing diagram is the same as the one for the prior art cells, except that Control 2 remains low during normal operations (and thus during Sample) to insure that TG2 does not become enabled.

During Extest operation, Select 2 disables TG1, therefore disabling the IC core logic from outputting data to the latchable output buffer 40. When the boundary scan cell of FIG. 4 is first placed into Extest operation, the latchable buffer 40 needs to be loaded with the output from Mem1. To achieve this, a preload signal is output on Control 2 to cause TG2 to be enabled to drive the logic value from Mem1 to the latchable output buffer 40. After the preload signal on Control 2 goes away, TG2 is disabled and the latch buffer is used to maintain the logic value at the IC output. This preloading of the latchable output buffer is required the first time the cell is placed in Extest operation mode. After the initial preload operation is performed, all other logic transfers from Mem1 to the latchable output buffer will occur as the Mem1 to Mem2 transfers were described in the prior art boundary scan cells, i.e. in response to Control 2 input.

In Extest operation mode, the output of the latch buffer is input to Mux1 for capturing and shifting while the latchable output 40 buffer outputs stable test data. Connecting Mux1 to the output of the latch buffer allows observation of the IC output as in the prior art boundary scan cell of FIG. 3. During Extest operation, the boundary scan cell receives Select 1 and Control 1 input to capture the IC output pin data into Mem1 and then shift it out for inspection via the serial output. While Mem1 is capturing and shifting data, TG2 is disabled by Control 2 to allow the latchable output buffer 40 to maintain stable test data at the output pin. After Mem1 has completed its capture and shift operation it contains new test data to be loaded into the latchable output buffer 40. The latchable output buffer 40 loads the new test data from Mem1 via TG2 in response to a signal on Control 2. When the latchable output buffer 40 receives new test data, the data is output directly to the output pin. Mem2 of the prior art cells outputs new test data to the output pin by first passing the data through Mux2, i.e. not directly to the output buffer. An example of the boundary scan cell in Extest operation is illustrated in the timing diagram of FIG. 4A. Note that the preload signal on Control 2, described above to initially transfer the logic value from Mem1 to the latchable output buffer 40 at the beginning of the Extest operation, is not shown in the FIG. 4A timing diagram, but has already occurred when the Extest operation of FIG. 4A is entered. Note also that the cell of FIG. 4 does not require the additional Mux3 and Select 3 signal required in the prior art cell of FIG. 3 to perform the short circuit detection and correction feature.

In FIG. 6, the boundary scan cell logic includes Mux1, Mem1, three transmission gates (TG1, TG2, and TG3), and a latch buffer. The boundary scan cells of FIG. 4 and FIG. 6 are identical except for the inclusion in FIG. 6 of TG3 between the outputs of TG1 and TG2 and the input to the latchable output buffer 40. While TG1 and TG2 can be any type of signal transfer element as shown for example in FIG. 5, TG3 must be able to transmit signals bi-directionally. So TG3 would need to operate as the transmission gate example of FIG. 5, or some other type of bi-directional signal transfer element. The reason for the bi-directional behavior of TG3 is discussed below. One or more of TG1, TG2, and TG3 could be implemented as part of the latchable output buffer 40 in the IC's output buffer region to reduce the amount of test logic in the IC core region to as little as Mux1 and Mem1.

In normal operation of the IC, TG1 and TG3 are enabled to pass system data to the input of the output buffer, and TG2 is disabled. In test operation of the IC, TG2 and TG3 are enabled to pass test data from Mem1 to the input of the output buffer, and TG1 is disabled. When TG3 is enabled it overdrives the output of the latch buffer to pass system or test data to the output pin. When TG3 is disabled, the latch buffer maintains feedback from the IC output to the input of the output buffer to latch and hold test data at the output pin.

During Sample operation, the IC is in normal mode wherein Select 2 enables TG1, a Transfer signal enables TG3, and Control 2 disables TG2. In normal operation mode, the output of the IC's core logic passes through TG1 and TG3 to be output from the latchable output buffer 40. During Sample, the boundary scan cell receives Select 1 and Control 1 input to first capture into Mem1 the system data output from TG1 to Mux1, and then shift the captured data out for inspection via the serial output. This Sample operation is thus the same as described for the cell of FIG. 4. An example of the FIG. 6 boundary scan cell in Sample operation is illustrated in the timing diagram of FIG. 6A

During Extest operation, Select 2 disables TG1, therefore disabling the IC core logic from outputting data to the latchable output buffer 40. When the boundary scan cell of FIG. 6 is first placed into Extest operation, the latchable buffer 40 needs to be loaded with the output from Mem1. To achieve this, a preload signal is output on Control 2 and Transfer to cause TG2 and TG3 to be enabled to drive the logic value from Mem1 to the latchable output buffer 40. After preloading the latchable output buffer, TG2 and TG3 are disabled to allow the latchable output buffer to maintain the preloaded logic value at the output pin.

During the capture step of the Extest operation, TG2 is disabled by Control 2 and TG3 is momentarily enabled by Transfer to allow the output of the latch buffer to be captured into Mem1 via Mux1. After the capture step, TG3 is disabled and the shifting step of the Extest operation is performed. The latchable output buffer 40 remains stable during the shifting step via the latch buffer feedback. The momentary enabling of TG3 by the Transfer signal allows the IC output to be captured as in the prior art boundary scan cell of FIG. 3, but without the overhead of the additional Mux3 and Select 3 signal required in the FIG. 3 cell. After Mem1 has completed its capture and shift operation it contains new test data to be loaded into the latchable output buffer 40. The latchable output buffer loads (updates) the new test data from Mem1 in response to a momentary enabling of TG2 and TG3 by the Control 2 and Transfer signals. The latchable output buffer holds the new test data at the output pin when TG2 and TG3 are disabled after the data is transferred.

An example of the FIG. 6 boundary scan cell in Extest operation is illustrated in the timing diagram of FIG. 6A. Again, note that the preload signals on Control 2 and Transfer, described above to initially transfer the logic value from Mem1 to the latchable output buffer 40 at the beginning of the Extest operation, are not shown in the limiting diagram of FIG. 6A, but have already occurred when the Extest operation of FIG. 6A is entered. Also note the bi-directional behavior of TG3 during the Extest capture and update operations. During the capture operation, TG3 is enabled by Transfer to pass data from the latchable output buffer 40 to Mem1 via Mux1, while during the update operation, TG3 is enabled by Transfer to pass data from Mem1 to the latchable output buffer 40.

During Intest operation in FIG. 6, Select 2 disables TG1, therefore disabling the IC core logic from outputting data to the latchable output buffer 40. When the boundary scan cell of FIG. 6 is first placed into Intest operation, the latchable output buffer 40 is preloaded with test data from Mem1 in the same manner as described in the Extest operation.

During the capture step of the Intest operation, TG1 is momentarily enabled by Select 2 while TG2 and TG3 remain disabled. Momentarily enabling TG1 allows system data from the IC core logic to be captured in Mem1 via Mux1. Since TG3 is disabled, the state of the latchable output buffer 40 is maintained during the capture step. After the capture step, TG1 is disabled along with TG2 and TG3 as the captured data is shifted out of Mem1. The momentary enabling of TG1 by Select 2 allows the IC's system data to be captured and shifted out as described in the Intest operation of the prior art boundary scan cell of FIGS. 1–3. After Mem1 has completed its capture and shift operation it contains new test data to be loaded (updated) into the latchable output buffer 40. The latchable output buffer 40 loads the new test data from Mem1 in response to a momentary enabling of TG2 and TG3 by the Control 2 and Transfer signals. The latchable output buffer 40 holds the new test data at the output pin when TG2 and TG3 are again disabled. An example of the boundary scan cell in Intest operation is illustrated in the timing diagram of FIG. 6A.

Again, note that the preload signals on Control 2 and Transfer, described above to initially transfer the logic value from Mem1 to the latchable output buffer 40 at the beginning of the Intest operation, are not shown in the FIG. 6A timing diagram but already have occurred when the Intest operation of FIG. 6A is entered.

While the above described way of loading (updating) Mem1 data into the latchable output buffer 40 during Extest and Intest is preferred for output pin short circuit protection (as will be described later), an alternate loading method is possible. The alternate method is similar to the one described above except that Control 2 for the cell of FIG. 4 and Control 2 and Transfer for the cell of FIG. 6 are activated to enable TG2 of FIG. 4 and TG2 and TG3 of FIG. 6, respectively, immediately when Extest or Intest is entered. This condition remains in effect during Extest and Intest except when data is being captured and shifted in Mem1. Using this alternate method, TG2 (FIG. 4) or TG2 and TG3 (FIG. 6) output Mem1 test data to the latchable output buffer 40 at all times except when Mem1 is capturing and shifting test data. During capture and shift operations, Control 2 or Control 2 and Transfer are operated as required (for example as described above with respect to FIGS. 4 and 6) to cause the appropriate data (output data for Extest or IC data for Intest) to be captured and shifted in Mem1. After the capture and shift operation completes, Control 2 or Control 2 and Transfer again enable TG2 or TG2 and TG3 to transfer test data to the latchable output buffer 40. Rather than the previously described momentary activation of Control 2 or Control 2 and Transfer to pass Mem1 data to the latchable output buffer 40, this alternate method uses continuous levels on Control 2 or Control 2 and Transfer to continuously transfer Mem1 data to the latchable output buffer except during Mem1 capture and shift operations. The operation of Control 2 or Control 2 and Transfer using this alternate control method is shown in the timing diagrams of FIGS. 4B and 6B.

One benefit of using momentary Control 2 or Control 2 and Transfer signals, rather than holding them at enabling levels, is that the momentary activation allows TG2 or TG2 and TG3 to pass test data to the latchable output buffer 40 during a short period of time, and then allows the latch buffer to latch and hold the test data at the output pin. Holding Control 2 or Control 2 and Transfer at enabled states forces TG2 or TG2 and TG3 to drive test data to the latchable output buffer 40 continuously, overriding the short circuit corrective action of the latch buffer feedback feature.

For example, if a short to ground existed on the IC output pin and the momentary control method were used to transfer a logic one from Mem1 to the latchable output buffer 40, the latchable output buffer would temporarily force (during the Control 2 or Control 2 and Transfer time) the output to a logic one. However, after the momentary control goes away, the latchable output buffer 40 would, due to the output feedback from the latch buffer, immediately switch from outputting a logic one to outputting a logic zero, thus removing the voltage contention at the IC output pin. If the alternate (continuous) control method were used to continuously transfer a logic one from Mem1 to the latchable output buffer 40, the latchable output buffer would attempt to continuously force the shorted output to a logic one for as long as Control 2 or Control 2 and Transfer are set high. The advantage of the momentary control method over the continuous control method then, is that it reduces the time a short circuit (or other voltage contention) condition can exist on an output pin, and therefore reduces the possibility of an output buffer being damaged or destroyed.

The boundary scan cells of FIGS. 4 and 6 provide improved short circuit protection over the method employed in prior art FIG. 3. In FIG. 3, the short circuits to ground or supply voltages (logic zero or one) are corrected by performing back to back scan operations (Extest 1 and Extest 2). The method of FIG. 3 allows a shorted output to be maintained for the number of TCK periods required to go from updating test data in Extest 1 to updating test data in Extest 2. Using the IEEE 1149.1 test standard timing as an example, a minimum of four TCK periods must occur between the above-described Extest 1 and Extest 2 update steps. Using the prior art boundary scan cell of FIG. 3, a short circuit will exist at an output pin for at least 4 TCK periods. TCK frequencies can range from single step rates of say 1 hertz, to free running rates of say 20 megahertz. While a low current output buffer may be able to tolerate a short of a given duration without complete destruction, a high current output buffer may not. Even if an output buffer appears to operate normally after being shorted for 4 TCK periods, it may be so degraded by the short as to significantly reduce its life expectancy in the field, causing early and unexpected system failures. Also, multiple pin shorts can occur, causing multiple output buffers to be stressed between update steps, causing heat to build up in the IC.

Using the boundary scan cells of the present invention in FIGS. 4 and 6, the latchable output buffer 40, when used in combination with the momentary control method of Control 2 (FIG. 4) or Control 2 and Transfer (FIG. 6), significantly reduces the time an output buffer can be forced into a short circuit condition. For example, the Control 2 or Control 2 and Transfer signals can be made to momentarily enable TG2 or TG2 and TG3 for only one half TCK period during update. After the momentary update enable goes away, the latch buffer provides feedback to correct for any output short condition immediately. In comparing short circuit correction times between the boundary scan cell of FIG. 3 (4 TCK periods) and those of FIGS. 4 and 6 (½ TCK period), the cells of the present invention correct shorts in 12.5% of the time it takes the prior art cell to correct shorts. Therefore the invention reduces the potential for output buffers to be degraded or destroyed during Extest or Intest operation. The reason for this improved short circuit protection provided by the invention is that the latchable output buffer 40 immediately and asynchronously corrects for logic differences between the input and the output of the output buffer using the latch buffer as a feedback mechanism.

When 3-state (3S) output buffers are used in ICs, FIG. 1 prior art boundary scan cells are placed at the data input and at the 3-state control input of the 3-state output buffer, as shown in FIG. 7. These boundary scan cells allow inputting system data and 3-state control to the 3-state buffer.

FIG. 8 shows an example of how a boundary scan cell similar to FIG. 4 can be used to control 3-state output buffers. During normal operation, the 3-state (3S) buffer of FIG. 8 is enabled or disabled by the 3S control output from the IC's core logic. In test operation, the 3-state buffer is enabled or disabled by the test data stored into the latchable output buffer 81 of the boundary scan cell 80 of FIG. 8. Note that the boundary scan cell 80 of FIG. 8 uses a normal data buffer 82 to produce the latchable output, instead of using the IC output buffer as shown in FIGS. 4 and 6. The operation of the FIG. 8 cell 80 is the same as in FIG. 4. Although the boundary scan cell 80 uses a normal data buffer 82 to create the Mem2 function instead of using the IC output buffer as shown in FIGS. 4 and 6, the cell 80 still requires less logic than the prior are cells in FIGS. 1 and 7, even without using the output buffer as part of the cell.

Figure 9:
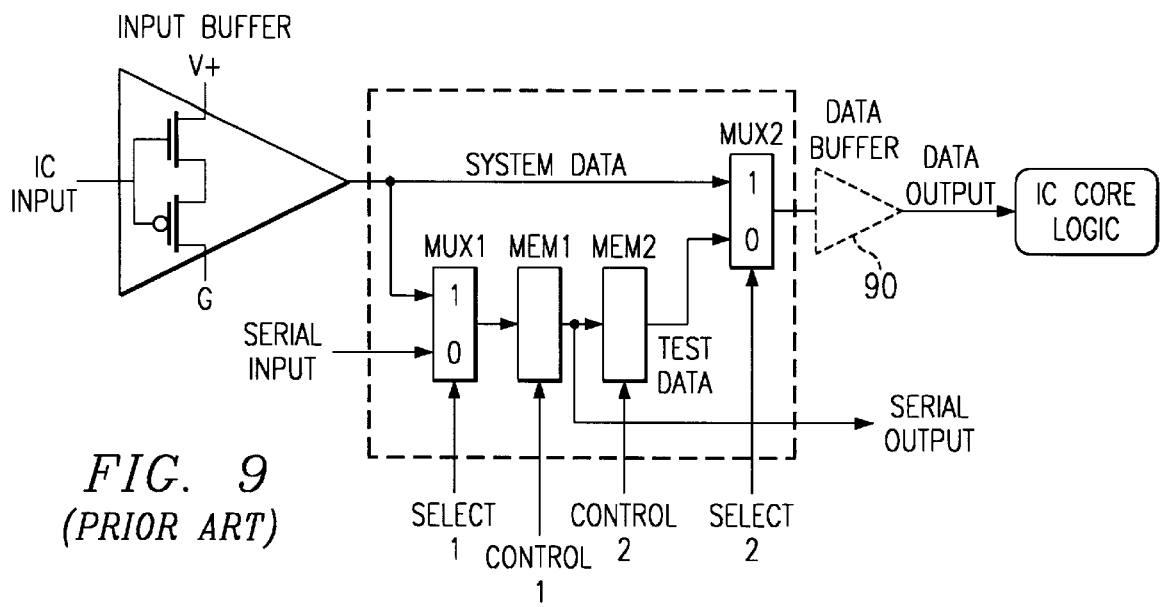
FIG. 9 illustrates a prior art input boundary scan cell structure.

FIG. 9 shows an example of how the prior art boundary scan cell of FIG. 1 is used on IC inputs. During normal IC operation the cell passes data from the output of the input buffer to the IC's core logic, via Mux2. During test mode the cell passes test data from Mem2 to the IC's core logic, via Mux2. In either mode, system data from the input buffer can be captured and shifted out of Mem1, as previously described with respect to the Sample operation. During test mode, the cell type of FIG. 9 allows holding the input to the IC's core logic at a stable state between update operations, via the use of Mem2 and Mux2. This holding of stable test data is important on asynchronous IC inputs like resets, enables, etc. A known problem with this approach is that the strong output drive capability of the input buffer is prevented from being utilized, since the output of Mux2 drives the core logic. In many cases a large data buffer 90 (shown in dotted lines) is required on the output of Mux2 to provide the required drive to the core logic. This high drive data buffer 90 increases logic overhead and introduces an additional delay in the input data signal path.

Figure 10:
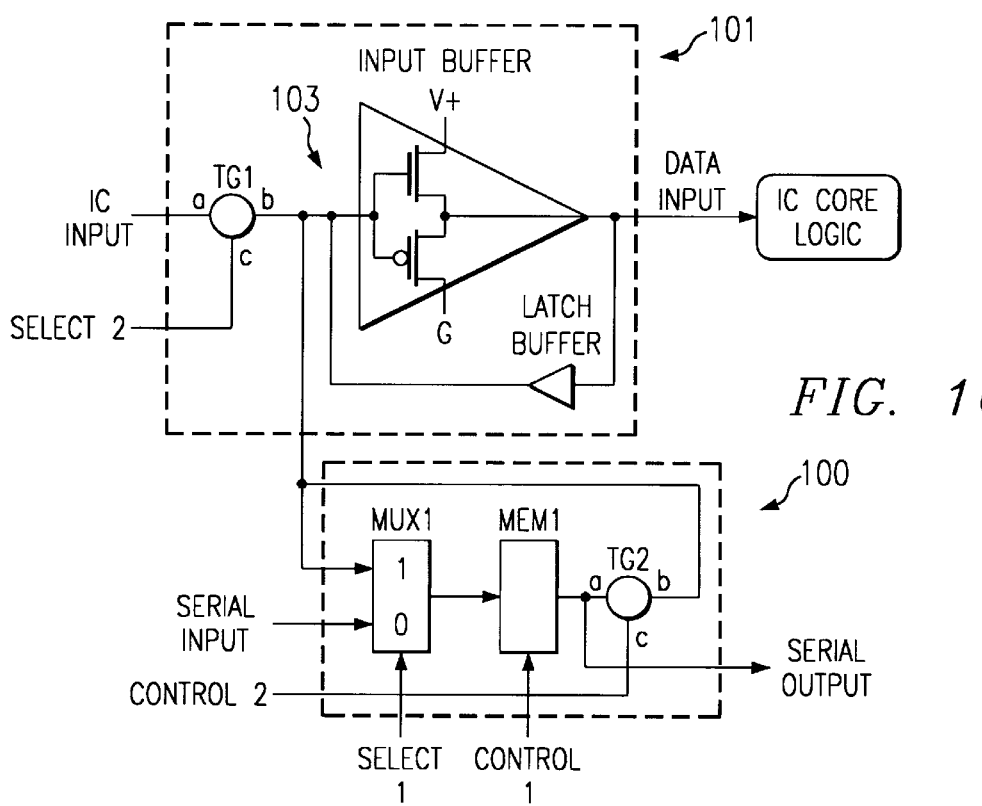
FIG. 10 illustrates an exemplary input boundary scan cell structure according to the present invention.

FIG. 10 illustrates an exemplary boundary scan cell according to the present invention implemented at an IC input. The boundary scan cell is shown in two parts. The first part 100 includes Mux1, Mem1, and TG2, and the second part 101 includes TG1, and a latchable input buffer 103 comprising the IC input buffer and a latch buffer. While the circuit elements of the FIG. 10 boundary scan cell can be placed anywhere in the IC, in the FIG. 10 example the first part 100 is implemented in the IC core logic region, and the second part 101 is implemented in the IC input buffer region. The Mem2 function of the prior art boundary scan cell of FIG. 9 is realized in the input boundary scan cell of FIG. 10 by the combination of TG2, the IC input buffer, and the latch buffer. Also the Mux2 function of the prior art cell of FIG. 9 is realized in FIG. 10 by TG1 and TG2.

During Sample, TG1 is enabled by Select 2 to input data to the IC core logic via the input buffer, and TG2 is disabled by Control 2. Select 1 and Control 1 inputs can be applied to allow the data output from TG1 to be captured and shifted out of Mem1 to provide the Sample operation. During Extest, TG1 is enabled by Select 2 to allow Mem1 to capture and shift out data input to the IC in response to the Select 1 and Control 1 signals. During Intest, TG1 is disabled by Select 2 to block external signal interference while Mux1, Mem1, and TG2 are operated analogously to the previously described cell of FIG. 4 to; (1) capture test data from the output of the latchable input buffer 103, (2) shift data from serial in to serial out, and (3) update new test data to the input of the latchable input buffer 103 to be input to the IC core logic. The latchable input buffer is preloaded with test data from Mem1 at the beginning of Intest in the same way that latchable output buffer 40 is preloaded, as previously described with respect to FIG. 4. The FIG. 10 cell allows the input buffer to drive the core logic and thus eliminates the need for the additional high drive data buffer 90 of FIG. 9 and the signal delay it introduces.

Figure 11:
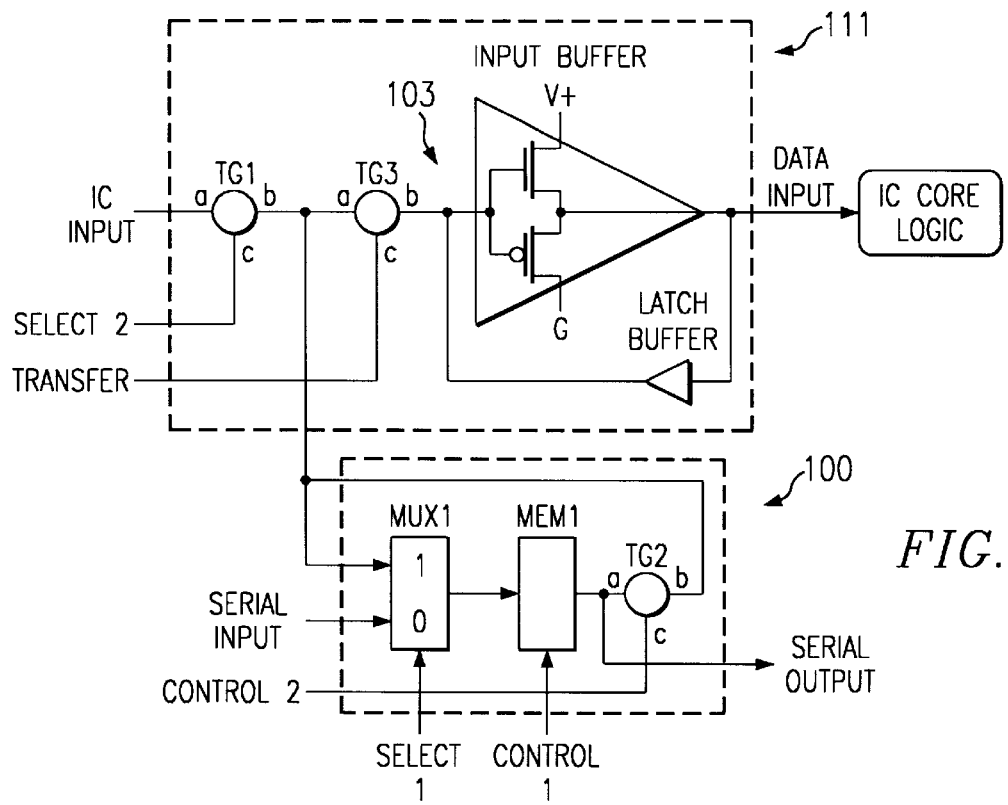
FIG. 11 illustrates another exemplary input boundary scan cell structure according to the present invention.

In FIG. 11, another exemplary boundary scan cell is implemented at an IC input. The FIG. 11 boundary scan cell is similar to the one of FIG. 10 except that the second part 111 includes TG3 at the input of the latchable input buffer 103. TG3 allows the FIG. 11 cell to input a safe logic value to the IC core logic during Extest. The Mem2 function of the prior art boundary scan cell of FIG. 9 is realized in the input boundary scan cell of FIG. 11 by the combination of TG2, TG3, the IC input buffer, and the latch buffer. Also the Mux2 function of the prior art cell of FIG. 9 is realized in FIG. 1 by TG1, TG2 and TG3.

During Sample, TG1 and TG3 are enabled by Select 2 and Transfer to input data to the IC core logic via the input buffer, and TG2 is disabled by Control 2. Select 1 and Control 1 inputs can be applied to allow the data output from TG1 to be captured and shifted out of Mem1 to provide the Sample operation. During Extest, TG1 is enabled by Select 2 to allow Mem1 to capture and shift out data input to the IC in response to the Select 1 and Control 1 signals. In Extest, TG3 is disabled by Transfer to allow the latchable input buffer 103 to hold stable data to the IC core logic during capture and shift operations, which prevents the core logic from seeing the logic input to the input pin during test. The Transfer signal can be controlled to continuously hold safe data to the core logic or can be controlled in conjunction with Control 2 and TG2 to update new test data from Mem1 to the latchable input buffer 103 at the end of each scan operation. During Intest, TG1 is disabled by Select 2 to block external signal interference while Mux1, Mem1, TG2, and TG3 are operated analogously to the previously described cell of FIG. 6 to; (1) capture test data from the output of the latchable input buffer 103, (2) shift data from serial in to serial out, and (3) update new test data to the latchable input buffer 103 to be input to the IC core logic. At the beginning of Intest or Extest, TG2 and TG3 are operated to preload data from Mem1 to the latchable input buffer 103 in the same manner that latchable output buffer 40 is preloaded, as previously described with respect to FIG. 6. The input boundary scan cell implementation of FIG. 11 allows the input buffer to drive the core logic and thus eliminates the need for the additional high drive data buffer 90 of FIG. 9 and the signal delay it introduces.

The above-described invention thus provides advantages including: in FIG. 4 the combination of TG2, the latch buffer, and the output buffer realize the Mem2 function of the prior art boundary scan cells, therefore reducing test logic overhead significantly; in FIG. 6 the combination of TG2 and TG3, the latch buffer, and the output buffer realize the Mem2 function of the prior art boundary scan cells, therefore reducing test logic overhead significantly; one or both of TG1 and TG2 of FIG. 4, and one or more of TG1, TG2, and TG3 of FIG. 6 can be integrated into the output buffer region of the IC to reduce the boundary scan logic required in the IC's core logic to as little as Mem1 and Mux1; in FIG. 4, TG1 and TG2 realize the Mux2 function of the prior art boundary scan cells, therefore reducing test logic overhead significantly; in FIG. 6, TG1, TG2 and TG3 realize the Mux2 function of the prior art boundary scan cells, therefore reducing test logic overhead significantly; the boundary scan cells of FIGS. 4 and 6 allow testing the logic state of the IC output pin, via the latch buffer feedback path, without having to add a third multiplexer, selection control and a short Extest operation as required in the prior art cell of FIG. 3; TG3 of FIG. 6 is bi-directional, allowing output pin data to be passed to Mem1 during Extest capture operations, and allowing Mem1 data to be passed to the output pin's latchable output buffer during Extest or Intest update operations; the latchable output buffer allows for immediate and asynchronous correction of voltage level conflicts at the IC output of the output buffer; a normal data buffer can be used in place of the IC output buffer to achieve the function of Mem2, as seen in FIG. 8; the output boundary scan cell structures of FIGS. 4 and 6 can be adapted for use at IC inputs as shown in FIGS. 10 and 11; the Mem2 function of prior art input boundary scan cells can be realized by using either TG2 and a feedback latch buffer (FIG. 10) or TG2 and a feedback latch buffer and TG3 (FIG. 11), in combination with the IC input buffer; the Mux2 function of prior art input boundary scan cells can be realized by TG1 and TG2 (FIG. 10) or TG1, TG2 and TG3 (FIG. 11); and the input boundary scan cells of FIGS. 10 and 11 allow the IC input buffer to drive the core logic, eliminating the need for a high drive data buffer on the Mux2 output of prior art cells.

Printed wiring boards and other multi-chip modules which include multiple ICs are conventionally powered up with the test logic of the ICs configured to put the IC in its normal operating mode wherein, for example, the IC core logic is connected directly to the IC output buffer to drive off of the IC. However, a newly assembled printed wiring board or other multi-chip module could include defects which cause one or more IC output pins to be shorted to ground supply voltage, or other IC pins. If such defects exist at the time of initial power up of the newly assembled multi-chip module, then the output buffers which drive the shorted IC pins, which output buffers are directly connected to the core logic of the IC, could be damaged by the short circuits before testing could be done. The invention therefore provides a structure, method and procedure for using the boundary scan cells of FIGS. 4 and 6 in a way that prevents ICs from outputting data on output buffers until testing for shorts has been performed.

Figure 12:
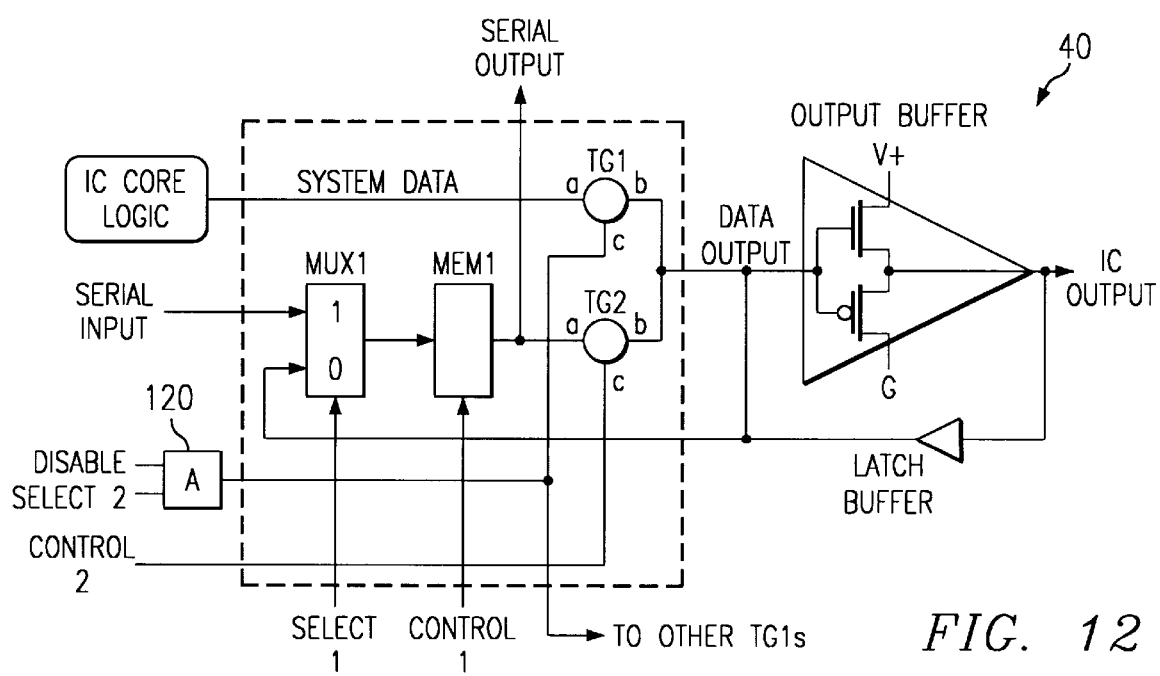
FIG. 12 illustrates a modification to the structure of FIG. 4 to permit safe power up of an IC whose outputs are shorted.

FIG. 12 illustrates a boundary scan cell identical in structure and operation to the one in FIG. 4, except that TG1 is controlled by a signal output from an AND gate 120 instead of the Select 2 signal. The AND gate receives two inputs, Select 2 and Disable. All signals previously described relative to FIG. 4 operate the same in FIG. 12. The Disable signal and the AND gate are the differences between FIGS. 4 and 12. The AND gate is not a required part of each boundary scan cell, but rather is a single gate whose output is input to plural output boundary scan cells in the IC.

When the IC is powered up, the Disable signal is set low. The source of the Disable signal could be an IC input pin. When Disable is low at power up, the latchable output buffer 40 is not driven by the IC core logic, but rather the IC output goes to a stable state in response to feedback from the latch buffer. If a short to ground existed at the IC output, the stable state would be a logic zero. If a short to supply voltage existed at the IC output, the stable state would be a logic one. If no short existed, the stable state would be the logic level input by the latch buffer. The latch buffer could be designed with hysteresis to avoid oscillation of the latchable output buffer 40 when the IC output is not shorted to ground or supply voltages.

Because the low Disable signal serves only to isolate the core logic from the output buffer via TG1, it does not affect the Extest operation as described above relative to FIG. 4. Thus, after the IC has been powered up as described, an Extest operation can be performed as described relative to FIG. 4. Once in Extest operation, the boundary scan cells are operated to test for shorted outputs. It is important to note that the Extest portion of the boundary scan cell is not disabled by the Disable signal, just TG1. If shorts are detected, they are repaired. After repairing shorts, or determining the absence of shorts, the IC is placed in normal operation to enable its function, i.e. boundary scan cell set to normal mode and the Disable signal is inactivated. This sequencing from power up, to output disable, to Extest operation, and then to normal operation (if testing passes) provides a way to protect IC outputs from being damaged by the conventional power up method used with prior art boundary scan cells. This procedure prevents the IC outputs from ever being subjected to voltage contention since the output buffers are not driven by the IC's core logic until the Extest operation has been performed to verify that no output shorts exist or to identify shorts for repair.

The Disable signal need only be used on the initial power up of a newly assembled board containing ICs. After the ICs on the board have been tested for output shorts, the source of the Disable signal (a pin, for example) can be inactivated or removed so that future power up operations will cause the IC to enter normal operation immediately. Alternatively, however, the Disable signal can also be used as desired, for example, each time the board is powered up, or selectively when the board is powered up.

Figure 13:
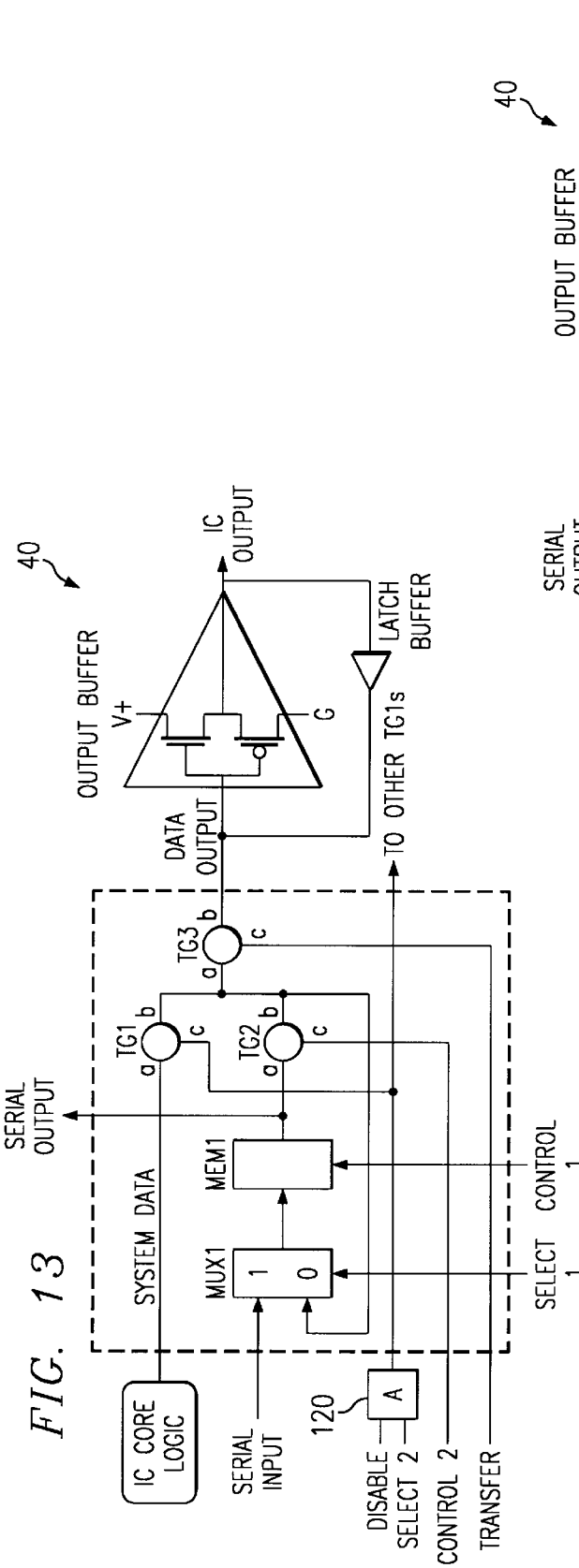
FIG. 13 illustrates a modification of the structure of FIG. 6 to permit safe power up of an IC whose outputs are shorted.

FIG. 13 illustrates how the boundary scan cell of FIG. 6 can be designed to include the safe power up feature. Like the cell in FIG. 12 the Disable signal does not prevent the cell of FIG. 13 from performing the Extest operation, it just disables TG1.

The above-described invention thus provides advantages including: a short circuit test procedure and protection method for newly assembled boards or multi-chip modules; a Disable feature to allow IC output pins to go to nonconflicting states on power up; testing for shorts prior to enabling the IC to enter normal operation; a sequence of steps at power up to insure that no shorts exist on IC output pins; and feedback designed into the IC output buffer, and the ability to disable the core logic output to enable safe IC power up even with outputs shorted.

Figure 14:
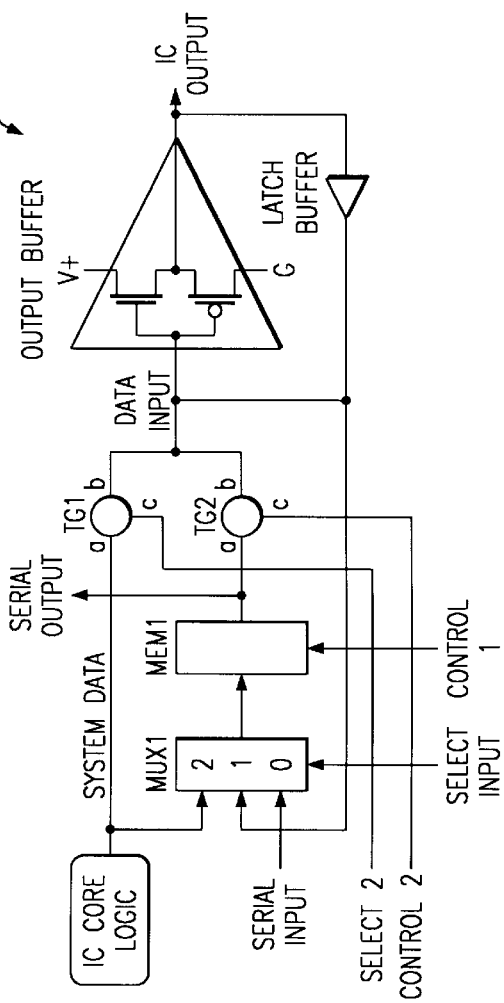
FIG. 14 illustrates another exemplary output boundary scan cell structure according to the present invention.

FIG. 14 illustrates an alternate output cell design that provides Sample, Extest and Intest operations without having to use TG3 of FIG. 6, therefore eliminating its delay on signals during both test and normal IC operation. The output cell of FIG. 14 uses a three input multiplexer (Mux1) and additional select control signals (Select Input) instead of the two input Mux1 of FIGS. 4 and 6. Mux1 of FIG. 14 receives input from the core logic (system data), input from the latchable output buffer 40, and the serial input. Inputting the system data from the core logic directly to Mux1 eliminates the need for the signal isolation capability provided by TG3 in FIG. 6 during Intest. In Sample, TG1 of FIG. 14 is enabled and TG2 is disabled to allow normal system data flow. During Sample operation, Mux1 is controlled to input the system data to Mem1 for capturing and shifting out, as previously described. In Extest, TG1 of FIG. 14 is disabled and TG2 is operated as previously described to update test data to the latchable output buffer 40. During Extest operation, Mux1 is controlled to input the output pin data to Mem1 for capturing and shifting out, as previously described. In Intest, TG1 of FIG. 14 is disabled and TG2 is operated as previously described to update test data to the latchable output buffer. During Intest operation, Mux1 is controlled to input the system data to Mem1 for capturing and shifting out, as previously described.

In the exemplary cell of FIG. 14, the capturing of system and test data signals during Sample and Intest does not require passing the signals through TG1, whereas the cells of FIGS. 4 and 6 can capture and shift out system and test data signals that respectively pass through TG1 during Sample and Intest operations, which verifies the TG1 signal path. However, a special TG1 path test operation can be defined to allow Mux1 of FIG. 14 to capture and shift out system or test data from the output of TG1.

Figure 15:
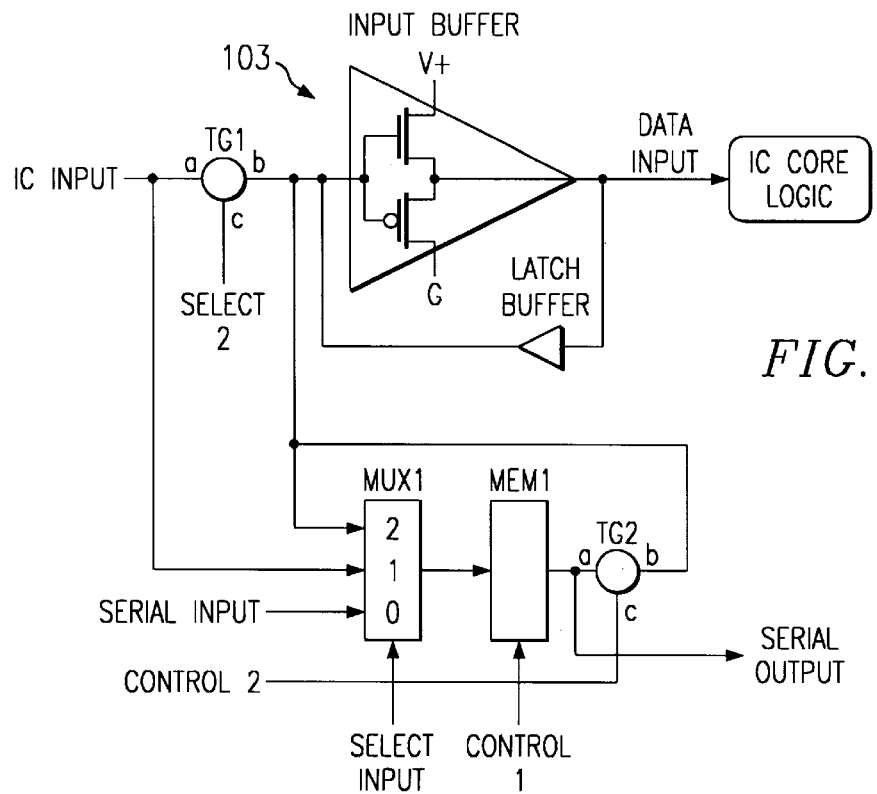
FIG. 15 illustrates another exemplary output boundary scan cell structure according to the present invention.

FIG. 15 illustrates an alternate input cell design that provides Sample, Extest and Intest operations without having to use TG3 of FIG. 11, therefore eliminating its delay on signals during both test and normal IC operation. The input cell of FIG. 15 uses a three input multiplexer (Mux1) and additional select control signals (Select Input) instead of the two input Mux1 of the FIGS. 10–11. Mux1 of FIG. 15 receives input from the input pin, input from the input of the latchable input buffer 103, and the serial input. Inputting the input pin data directly to Mux1 eliminates the need for the signal isolation capability provided by TG3 in FIG. 11 during Extest, since in the cell arrangement of FIG. 15, TG1 provides that function. In Sample, TG1 of FIG. 15 is enabled and TG2 is disabled to allow normal system data flow. During Sample operation, Mux1 is controlled to input data from the latchable input buffer 103 to Mem1 for capturing and shifting out, as previously described. In Extest, TG1 of FIG. 15 is disabled and TG2 is operated to update test data from Mem1 to the latchable input buffer, as previously described with respect to FIG. 11. During Extest operation, Mux1 is controlled to input the input pin data to Mem1 for capturing and shifting out, as previously described. In Intest, TG1 of FIG. 15 is disabled and TG2 is operated to update test data from Mem1 to the latchable input buffer 103, as previously described. During Intest operation, Mux1 is controlled to input system data from the output of the latchable input buffer 103 to Mem1 for capturing and shifting out, as previously described with respect to FIG. 11.

Figure 16:
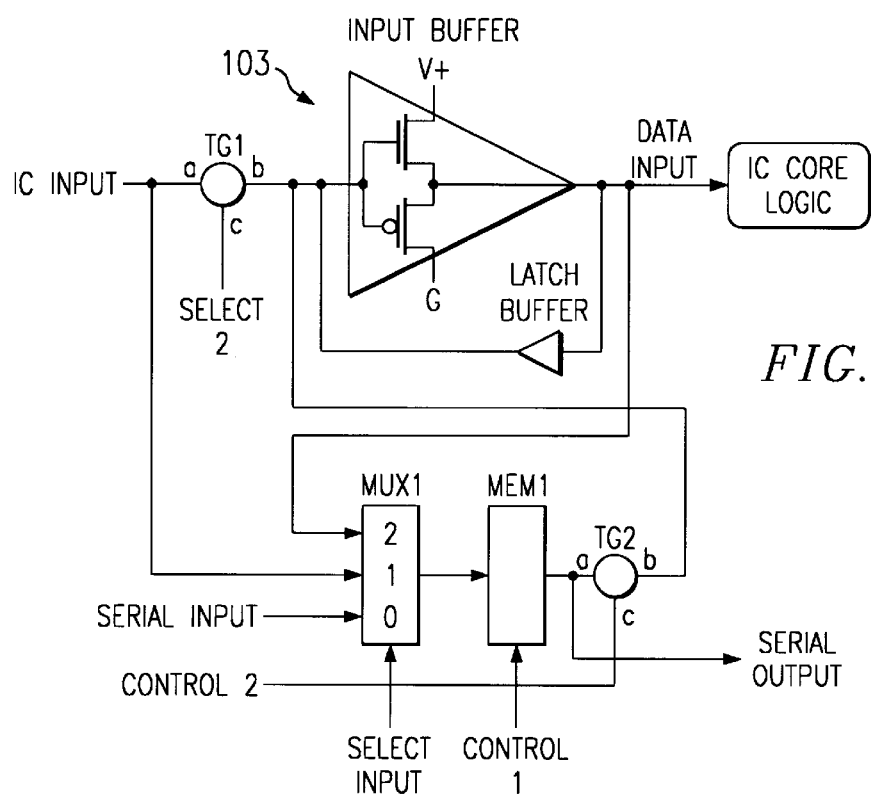
FIG. 16 illustrates another exemplary output boundary scan cell structure according to the present invention.

In FIG. 16, a cell similar to that of FIG. 15 is shown having separate connections for coupling the output of TG2 to the input of the latchable input buffer 103 and for coupling the output of the latchable input buffer to the input to Mux1. The operation of the cell is the same as in FIG. 15. The only difference is that the data update operation from Mem1 to the latchable input buffer (via TG2) and the data capture operation from the latchable input buffer to Mem1 occur over separate connections (i.e. separate and distinct signal paths) instead of over the same connection (i.e. a shared signal path) as shown in the cell of FIG. 15. In FIG. 15, the data output from the latchable input buffer 103 is captured into Mem1 via the feedback path through the latch buffer, whereas in FIG. 16 the data output from the latchable input buffer 103 is captured into Mem1 via the direct connection between the output of the latchable input buffer and Mux1. Some exemplary advantages of the separate connections for updating data to and capturing data from the latchable input buffer are: (1) ability to test the input buffer since the input is controllable and the output is observable via separate connections to the Mux1/Mem1/TG2 test circuitry, and (2) reduction of the load driven by TG1 (Mux1 input is removed from this load), which improves input signaling performance from the input pin, through TG1, to the latchable input buffer 103.

The input and output cells of FIGS. 14, 15 and 16 provide the same advantages as stated for the cells of FIGS. 4, 6, 10 and 11. The output cell of FIG. 14 can also be controlled as described with respect to the output cell in FIG. 12 to provide power up short protection.

While discussions so far have been limited to describing the new boundary scan cell for use in digital circuits, concepts of the invention apply also to analog circuits. Today analog boundary scan cells are being developed in an IEEE standard referred to as P1149.4. The analog test approach proposed in IEEE P1149.4 is described in a paper by Parker entitled "Structure and Metrology for an Analog Testability Bus" published in the 1993 International Test Conference Proceedings. The Parker paper presents an analog boundary scan method that is similar to digital boundary scan testing in that analog boundary scan cells on analog outputs are set to output logical levels and analog input cells on connected analog inputs capture those logical levels to verify the interconnect between output and input.

Figure 17:
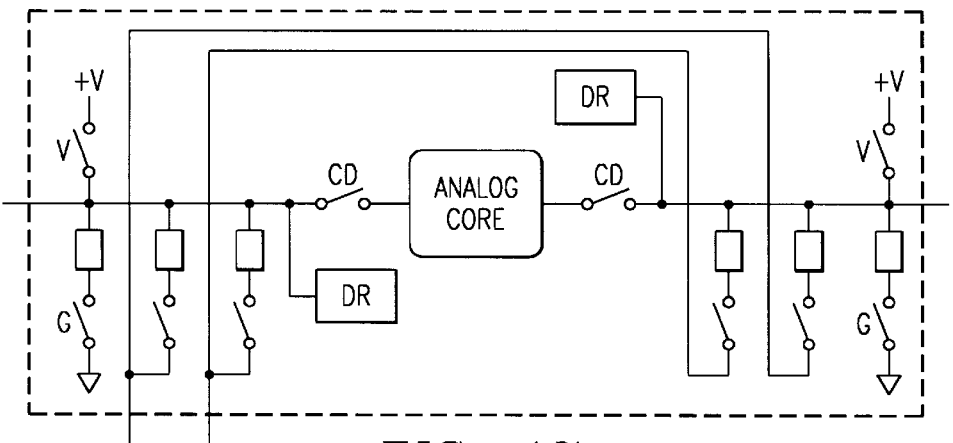
FIGS. 17–18 illustrate prior art boundary scan cells for use with analog circuitry.
Figure 18:
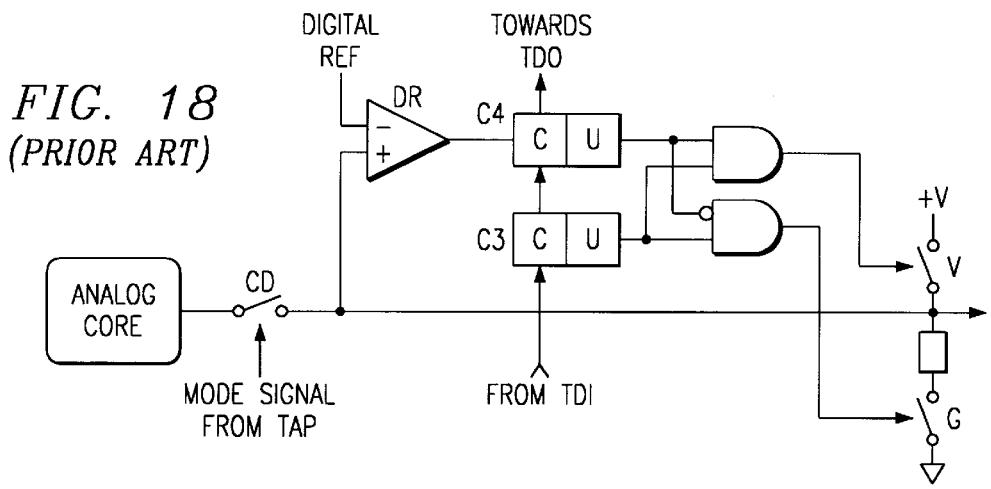

FIG. 17 illustrates the basic idea of the Parker paper for analog boundary scan cells at an analog circuit input and output. A digital test operation involves switches referred to in FIG. 17 as core disconnect (CD), V, and G, and a digital receiver (DR). In FIG. 18, a detail view of the analog boundary scan cell of the Parker paper includes scan cells C3 and C4 for controlling the opening and closing of switches V and G and the capturing of data (C4).

In FIG. 18: (1) Scan cells C3 and C4 each comprise a capture/shift memory (C) for capturing and shifting data and an update memory (U) for storing data updated from the capture/shift memory; (2) Gating is required on the output of the update memories to prevent V and G from ever being closed at the same time, as this would provide a high current path between the voltages connected to opposite ends of V and G; (3) DR, V, and G are connected to CD on the side opposite from the analog core, i.e. they are connected to the wire interconnect where signals depart from or arrive at the analog core, in which location the elements of the analog boundary scan cell are in close proximity and coupled to input and output circuitry such as electrostatic discharge protection circuitry; (4) The input or output nature of the analog signal associated with the cell is irrelevant, since the wire the cell is connected to is isolated from the core during test by CD; and (5) It is well known that CD can be implemented in many ways, i.e. it can be implemented as a series switch that opens to disconnect the wire from the analog core, or the disconnect effect could result from disabling (3-stating) the output of an analog output amplifier in the analog core.

Figure 19:
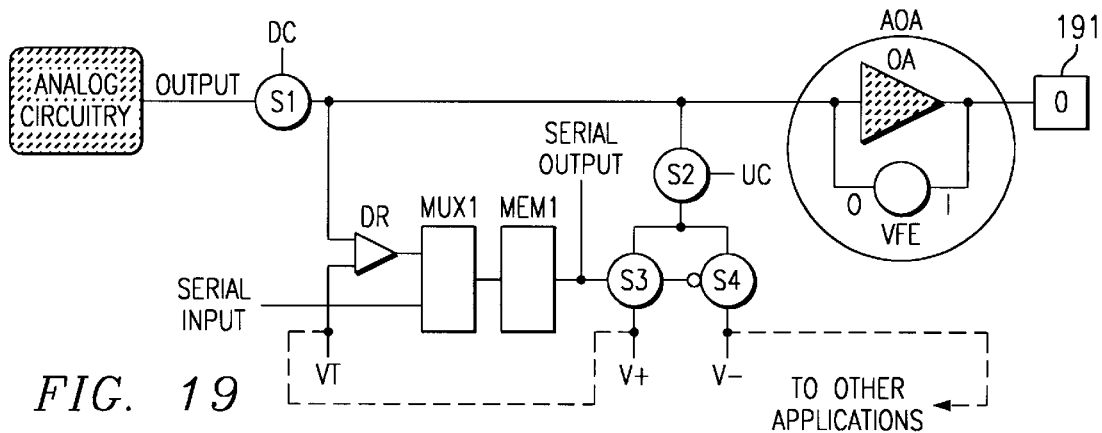
FIGS. 19, 19A and 19B illustrate an exemplary boundary scan cell according to the present invention for use with analog circuitry.

FIG. 19 shows an exemplary analog boundary scan cell (ABSC) according to the invention located between the analog circuitry and the analog output amplifier (OA) in an analog or mixed signal device. In this and all following ABSC examples, the OA is the circuitry that drives the output terminal 191 when the analog circuit is in normal or test operation. The OA could be a complete amplifier circuit, such as a unity gain voltage follower, or it could be the output transistor stage of an amplifier circuit whose remaining components reside in the analog circuitry. The ABSC includes Mux1 and Mem1, switching elements S1, S2, S3, and S4 (examples of which are shown in FIG. 5), a DR, a voltage feedback element (VFE), and the OA. Mux1 and Mem1 operate as previously described to capture and shift data. DR operates to compare the voltage on the analog circuitry output with a voltage threshold (VT) and output the result of the comparison to Mux1, as does the DR of the prior art cell of FIG. 18. While VT can be provided by a fixed internal voltage in the device, it is preferred to provide VT by an external input to the device to allow varying the VT level to improve DR's ability to compare against different output voltage levels. During test mode, the VFE and OA operate to form an adjustable output amplifier (AOA), similar to the way the feedback latch buffer and the output buffer of FIG. 4 form latchable output buffer (LOB) 40.

During normal operation, S1 is closed by a disconnect control (DC) signal, similar to the Select 2 signal of FIG. 4, to allow functional output from the analog circuitry via OA. In normal operation, VFE is disabled or, if enabled, is easily overdriven by S1 and does not impact the performance of the functional output. The VFE functions to provide feedback from the output of OA to the input of OA, so that if OA is not internally driven by S1 or S2, or powerfully driven by something connected to the external output terminal 191, the output voltage from OA will be maintained. This is similar to the way the feedback latch buffer maintains a logic state in the LOB 40 of FIG. 4. The combination of OA and VFE provide the AOA function when the ABSC is in test mode. In test mode, the AOA function serves as an update memory function.

Figure 19A:
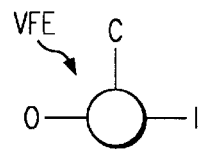
Figure 19B:
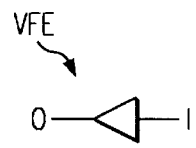

Two example circuits that could be used to provide the VFE function are shown in FIGS. 19A–19B. It should be understood that other circuit implementations could also be used to implement the VFE function as well. The FIG. 19A VFE example circuit is a switch that can be closed/enabled (via control input C) during test mode to provide feedback between the OA input and output and can be opened/disabled during normal functional mode. The FIG. 19B VFE example is a weak unity gain feedback amplifier that can be used to provide feedback between the OA input and output.

Prior to placing the ABSC in test mode, test data is shifted into Mem1. When test mode is entered, S1 is opened by DC to isolate the AOA from the analog circuitry, and S2 is momentarily closed by update control signal UC to precharge the AOA to the output voltage level selected by the data in Mem1, i.e. V+ or V–. This operation is similar to the operation described previously with respect to FIG. 4. The isolation provided by S1 is also similar to the way CD of FIGS. 17–18 isolates during test. One difference between the isolation techniques of prior art FIGS. 17–18 and the ABSC of FIG. 19 is that when the prior art cell of FIG. 18 isolates via CD, no functional analog circuitry remains connected to the IC terminal, whereas the OA remains connected to the output terminal in FIG. 19 and is located between the output terminal and the remainder of the ABSC.

The output section of the FIG. 19 ABSC includes switches S2, S3, and S4, and AOA. S3 and S4 are connected to voltages V+ and V– that are used as high and low voltage output levels during test. V+ and V– can be either internally provided inside the analog device or provided via external inputs to the analog device. The selection control that operates S3 and S4 comes from Mem1. Mem1 control only allows one switch to close at a time. In this example, if Mem1 outputs a low level, S4 is closed and S3 is opened, and if Mem1 outputs a high level, S3 is closed and S4 opened. When data is captured and shifted through Mem1, its output transitions between highs and lows (ripples), which causes S3 and S4 to close and open repeatedly. However, the effect of S3 and S4 closing and opening during capture and shift is isolated from AOA by opening S2. After the capture and shift operation completes, update control (UC) (similar to the Control 2 signal previously described with respect to FIG. 4) momentarily closes S2 to allow the voltage level selected by the data in Mem1 to be stored in and output from the AOA.

In FIG. 19, the position of S2 isolates the AOA from the output ripple from S3 and S4 during capture/shift operations. The isolation effect of S2 enables a single memory (Mem1) to be used to select between two voltage levels (V+ or V–) that are to be output from the AOA during the update operation, i.e. the FIG. 19 ABSC only requires a single voltage selection memory. In contrast, the prior art cell of FIG. 18 requires four memories (C and U of C3 and C4) to select the V+ level and the V– level, and gating to prevent the two voltage levels from being simultaneously selected. The combination of S2 and AOA in FIG. 19 replaces the two update memories (U for V+ and U for V–) of the prior art cell of FIG. 18. Recognizing that the OA is required for functional operation in both the prior art and in FIG. 19, the ABSC of FIG. 19 is seen to replace the four memories (C & U of C3 and C4) and gating of the prior art cell in FIG. 18 with one memory (Mem1), one switch S2, and the VFE. This savings in test logic overhead per analog output is advantageous. For example, assuming the gating area of the FIG. 18 prior art cell is equal to the S2 and VFE area of the FIG. 19 ABSC, the area savings of the FIG. 19 ABSC over the prior art cell is four memories versus one memory, or 75%.

Switches S2–S4 need not be large current capacity switches, because OA provides the output current drive. Similarly, the V+ and V– test voltage references need not have large current drive capability. This contrasts with the prior art cell of FIG. 18 wherein the test voltages and the switches V and G must have large enough current capacity to drive out from the IC. Thus, switches S3 and S4 require less circuit area than their counterparts V and G in FIG. 18. If VFE is realized as a switch (FIG. 19A) and is controlled to open as S2 closes and close as S2 opens, then S2 will not even require enough current capacity to overdrive VFE.

It is also important to note that while S2 is shown located between S3 and S4 and the analog output signal path to provide the ripple isolation and update functions, S3 and S4 could be directly connected to the analog signal path if they were controlled to perform the isolation and update functions. Exemplary benefits of using S2 are that it limits the load on the analog signal path to a single switch (S2), and a single switch (S2) is simpler to control to perform the isolation and update operations than two switches (S3 and S4).

Figure 23:
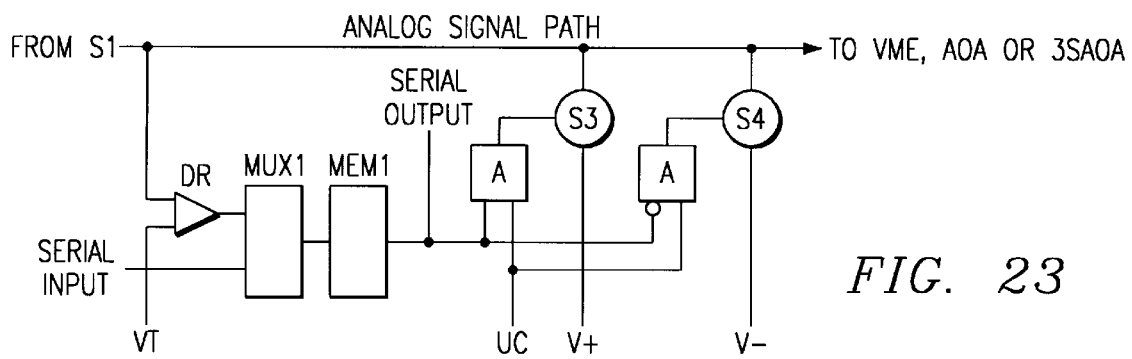
FIG. 23 illustrates an exemplary alternative to the arrangement of switches S3 and S4 in FIGS. 19–22.

FIG. 23 illustrates an exemplary embodiment of the aforementioned arrangement wherein S3 and S4 are directly connected to the analog signal path. In FIG. 23, switches S3 and S4 are controlled by the outputs of AND gates A. When UC is low, S3 and S4 are open. When UC is high, the output of Mem1 will close either S3 (Mem1 output=1) or S4 (Mem1 output=0). One advantage of FIG. 23 is that S3 and S4 are isolated from the scan path when UC is low, thus avoiding unnecessary, power-consuming operation of S3 and S4 during scan operations.

Figure 27:
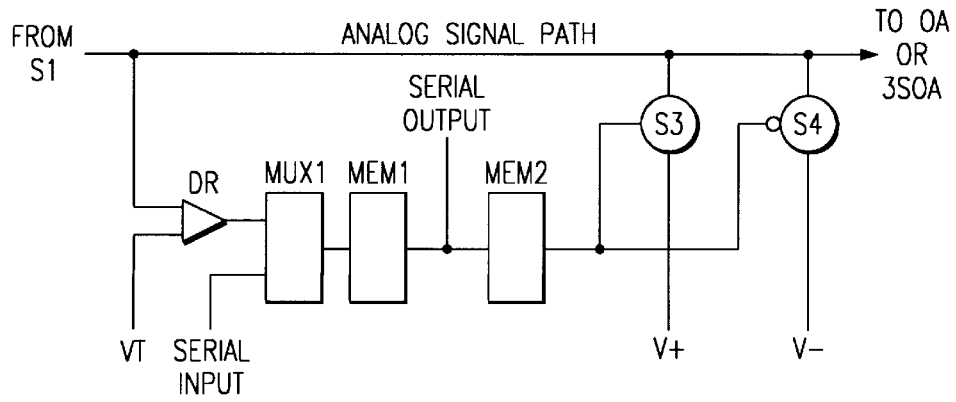
FIG. 27 illustrates another exemplary boundary scan cell according to the present invention for use with analog circuitry.

FIG. 27 illustrates another example wherein S3 and S4 are directly connected to the analog signal path. In exemplary FIG. 27, test data is shifted into Mem1 and then updated from Mem1 to Mem2 as is well known in boundary scan cells. The output of Mem2 controls S3 and S4. S3 and S4 are connected to the test voltages (V+, V–) and to the analog signal path. S3 closes and S4 opens in response to a logic 1 output from Mem2, causing the OA or 3SOA to output V+. S4 closes and S3 opens in response to a logic zero output from Mem2, causing the OA or 3SOA to output V–. Because OA/3SOA will provide the output current drive, S3 and S4 and the V+ and V– test voltage references need not have as much current drive capability as their counterparts in prior art FIG. 18, as discussed above.

The input section (Mux1 and Mem1) of the FIG. 19 ABSC captures and shifts out the data output from DR. In normal mode, the data captured from DR is the result of comparing VT to voltages output from the analog circuitry as shown in FIG. 19. In test mode, the ABSC captures data resulting from comparing VT to voltages received by the DR from the feedback element (VFE) of the AOA, not to voltages received directly from the output wire as in prior art FIG. 18. Note in FIG. 19 that during the capture step in test mode, S1 and S2 are both open, leaving the VFE as the sole driver of the input to DR.

Because S2 is open during capture, if one of the V+ and V– nodes is externally accessible and is connected (as shown in broken line connection) to VT, then the desired voltage reference can be applied to VT via the V+ or V– node for use by DR in the capture operation. Thus, VT is externally accessible via V+ or V–, and does not require a dedicated terminal for such external access. The V+ and V– nodes are also available for use in other applications in the IC while S2 is open, as shown in FIG. 19.

A unique feature of the FIG. 19 ABSC during test mode is the AOA's ability to: (1) maintain an output voltage level previously stored into AOA, as long as a normal output load is being driven, or (2) automatically correct the output voltage level previously stored into AOA if an unexpected output load is being driven. For example, if the output of the AOA drove another device and that device could electrically accept both an updated V+ and V− voltage level from the AOA without voltage contention, voltage clamping, or high current, the AOA will maintain the desired voltage output between S2 update operations. Examples of each of these situations are given below.

The following is an example of voltage contention. If the voltage output from AOA following an update operation from S2 was 10 volts, and this output was in contention with a stronger voltage source of say 5 volts, the AOA would quickly adjust its output voltage to be equal to the 5 volt level of the other voltage source via the feedback provided by the VFE. This adjustment minimizes current flow between the two voltage sources. The prior art cell of FIG. 18 would disadvantageously continue the voltage contention and high current output situation.

The following is an example of voltage clamping. If the voltage output from AOA following an update operation from S2 was 10 volts, and this output drove a Zener diode that clamps at 5 volts, the AOA would quickly adjust its output voltage to be equal to the 5 volt Zener via the feedback provided by the VFE. This adjustment minimizes current flow from the AOA through the Zener to ground. The prior art cell of FIG. 18 would disadvantageously continue the voltage conflict and high current output situation.

The following is an example of high current. If the voltage output from AOA following an update operation from S2 was −10 volts, and this output was shorted to ground by, for example, a manufacturing defect, the AOA would quickly adjust its output voltage to be equal to ground via the feedback provided by the VFE. This adjustment minimizes current flow into the AOA from the short to ground. The prior art cell of FIG. 18 would disadvantageously continue the voltage conflict and high current input situation.

During test mode, the ABSC of FIG. 19 receives update control (UC) to precharge the AOA with a selected voltage level (V+ or V−), via momentary closure of S2. This voltage level is output from the AOA to drive an input(s) of a connected device(s). The VT to the DR will be set to a voltage level between V+ and V− to allow DR to output a logic one if the AOA output voltage is greater than VT, or a logic zero if the AOA output voltage is less than VT. The AOA output voltage is input to DR via the VFE in the AOA. During a capture and shift operation, the input section (Mux1 and Mem1) of the FIG. 19 ABSC, as well as a similar input section (i.e. DR, Mux1, and Mem1) of an analog input cell of the device being driven, loads and shifts out the logic level from DR. This allows for; (1) testing the driving ABSC's output voltage level, (2) testing the receiving analog input cell's input voltage level, and (3) testing the interconnect between the driving and receiving cells.

An advantage of having VT controlled externally is to allow diagnostic testing to determine if the voltage intended to be output from the AOA actually is output. For example, if 10 volts is the intended output voltage, VT could be set to 9.5 volts. If AOA successfully drives out and maintains 10 volts at the output, DR will compare the 9.5 volt VT against the AOA voltage output of 10 volts, via the feedback from VFE. Seeing a 10 volt output level, the DR will output a logic one to the input section of the ABSC. This logic one can be captured and shifted out to indicate that the AOA was able to output and maintain the intended 10 volt output.

However, in the aforementioned voltage clamping example the intended AOA output voltage of 10 volts will be adjusted down to 5 volts. This 5 volt input to DR will result in a logic zero being captured and shifted out of the ABSC input section, which will indicate that the AOA was unable to output and maintain the intended 10 volt output.

By repetitively; (1) adjusting the externally controllable VT, (2) performing capture and shift operations, and (3) inspecting the captured data, it is possible to determine what voltage level the AOA is adjusted to. This ability to determine what voltage adjustments were made at analog outputs gives insight into what may be causing the adjustment to occur. For example, determining that an adjustment was made to a ground or supply voltage would indicate the possibility of a short existing between the analog output and a ground or supply voltage. It is important to note that since the AOA is able to adjust its output voltage to be equal to a conflicting voltage level, no damage, as a result of high current flow, occurs to the analog output or source/device it is connected for the period of time required to perform the diagnostic steps described above.

Figure 20:
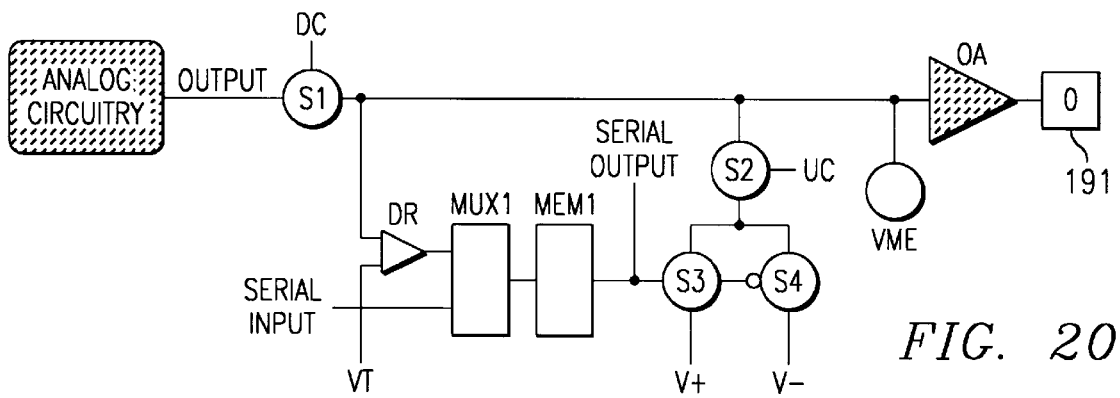
FIGS. 20–20A illustrate another exemplary boundary scan cell according to the present invention for use with analog circuitry.
Figure 20A:
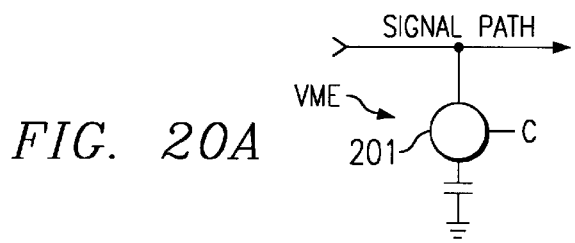

FIG. 20 illustrates another exemplary ABSC that uses a voltage maintenance element (VME) to hold the updated voltage to the OA input, and is otherwise similar to the FIG. 19 ABSC. In test mode, the function of the VME is to accept a voltage from S2 during update, and hold that voltage to the input of the OA until the next update time. In normal mode, the VME function is disabled or, if enabled, is easily overdriven by the functional output from the analog circuitry. In FIG. 20A, one example circuit that could be used to provide the VME function is shown to be a switched capacitor circuit. The switched capacitor circuit comprises a switch 201 connected on one end to the analog signal path and on the other end to a capacitor. The capacitor is connected between switch 201 and ground. During normal mode of the analog circuitry, the switch 201 is opened via control input C to isolate the capacitor load from affecting the analog output signal. When test mode is entered, the switch 201 is closed via control input C to connect the capacitor to the analog signal path. Also when test mode is entered, S2 is momentarily closed/enabled to charge the capacitor to the voltage level selected by Mem1, i.e. V+ or V−. The voltage level stored in the capacitor drives the input of the OA which then drives the analog output. During subsequent update operations, S2 is momentarily closed/enabled to charge new voltage levels into the capacitor which then are driven from the analog output via the OA. S2 is opened/disabled during capture and shift operations to prevent the rippling voltages from S3 and S4 from being seen by the capacitor. It will be understood that other circuits could be used to implement the VME function.

Figure 21:
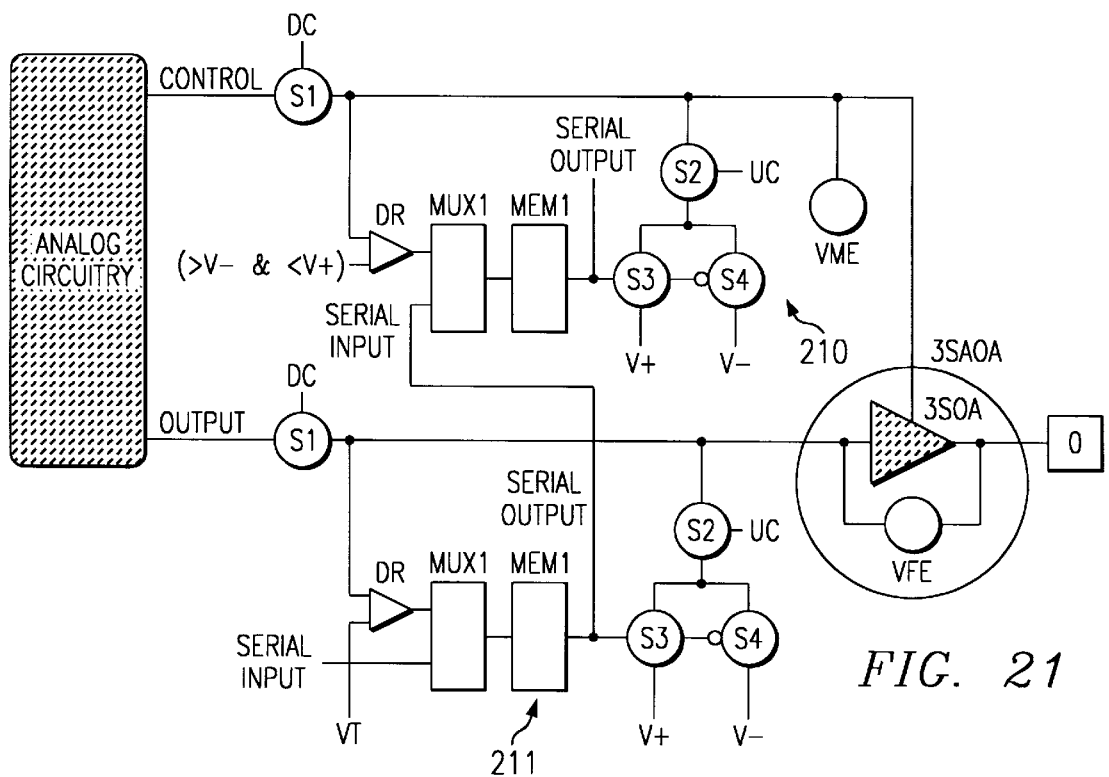
FIG. 21 illustrates another exemplary boundary scan cell according to the present invention for use with analog circuitry.

In FIG. 21, an exemplary ABSC for a 3-state analog output signal is shown. The 3-state ABSC 212 comprises at 211 the ABSC of FIG. 19 on the analog output signal path, and an ABSC 210 similar to the one shown in FIG. disabled (S1 closed, S2 open) and the analog circuitry regulates the operation of the 3-state analog output. During test mode, the control path ABSC 210 controls whether the 3-state adjustable output amplifier (3SAOA), comprising a 3-state output amplifier (3SOA) and VFE, is enabled or disabled. During test mode, the signal path ABSC at 211 controls and observes the voltage output from the 3SAOA. The control path ABSC 210 is shown having a DR that receives the voltage from the control path and a VT set at say the midpoint between V+ and V−. The V+ and V− of the control path ABSC 210 can be the same as the V+ and V− of the signal path ABSC 211, or can be different, but must be adequate to enable/disable the 3SAOA. The DR part of the control path ABSC is provided primarily to self test or monitor that the output section of the control path ABSC is setting the 3SAOA to an enabled or disabled state.

During test mode with the 3SAOA enabled by the control path ABSC 210, the signal path ABSC 211 operates the same as the ABSC in FIG. 19. During test mode with the 3SAOA disabled by the control path ABSC 210, the signal path ABSC 211 only serves to observe the output voltage, i.e. it cannot drive out a voltage. Exemplary differences between the ABSCs of FIGS. 19 and 21 are; (1) the 3-state ABSC 212 of FIG. 21 has two Mem1s to load and unload during each capture and shift operation, (2) the 3-state ABSC 212 of FIG. 21 can disable the output and only observe voltages driven at the output by another device, and (3) the 3-state ABSC 212 of FIG. 21 captures and shifts out more information about the output, i.e. it indicates whether it is enabled and driving out a voltage or whether it is disabled and being driven by an external voltage.

Figure 22:
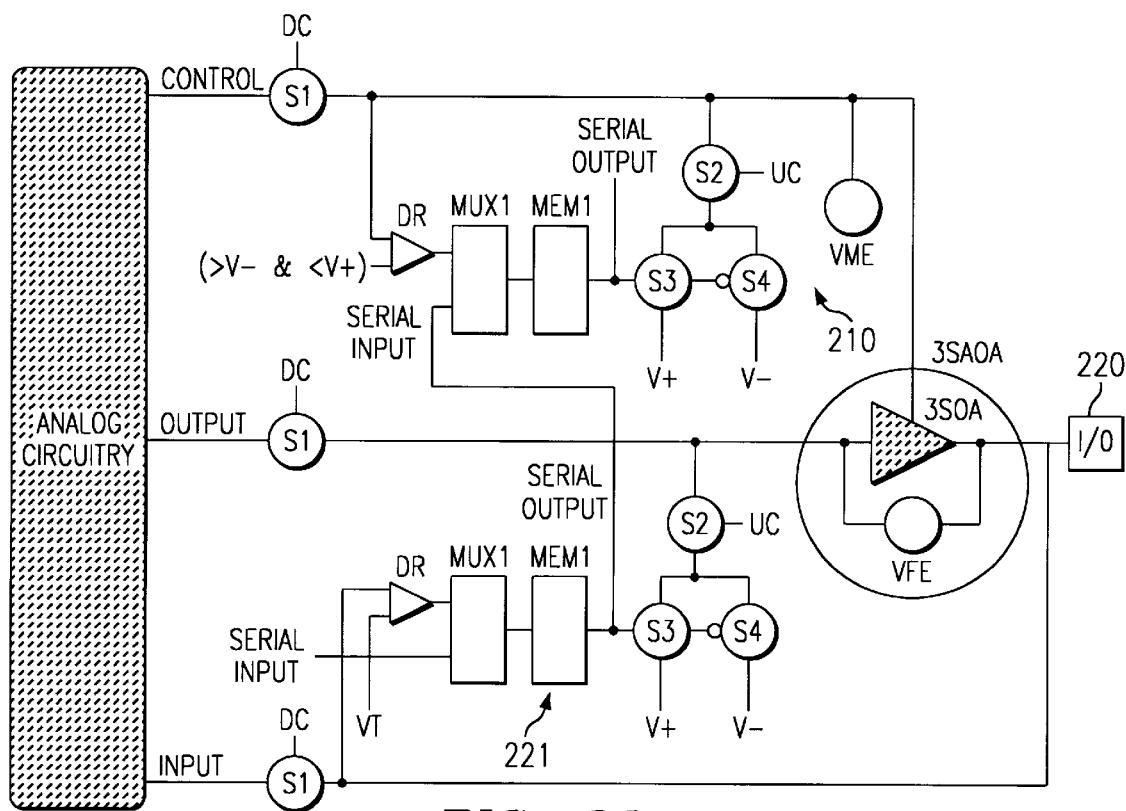
FIG. 22 illustrates another exemplary boundary scan cell according to the present invention for use with analog circuitry.

In FIG. 22, an ABSC for an input/output (I/O) analog signal is shown.

The I/O ABSC of FIG. 22 is similar to the 3-state ABSC of FIG. 21. During functional mode, one difference is that analog signals pass in both directions between the I/O terminal 220 and the analog circuitry. During test mode, one difference is that the ABSC 221 on the output signal path observes the I/O voltage entering on the input signal path, not the output voltages on the output signal path as in the 3-state ABSC of FIG. 21. One benefit of this alternate voltage observation connection point is that it allows testing that the voltage intended to be output from the I/O pin is present on the input signal path.

As previously mentioned in regard to digital outputs, when newly assembled boards or MCMs are first powered up shorts may exist on the outputs to ground or a voltage supply. After power up, these shorts may degrade or destroy output buffers before they can be detected. It is important therefore to provide a way to safely power up boards or MCMs without subjecting them to potential shorts. FIGS. 12 and 13 illustrated how digital outputs can be protected from shorts by the use of a disable input gated with the select 2 control to TG1 via AND gate 120. At power up the disable is set to a state that opens TG1 and allows the feedback latch buffer to correct for any output contention present at the digital output buffer.

Figure 24:
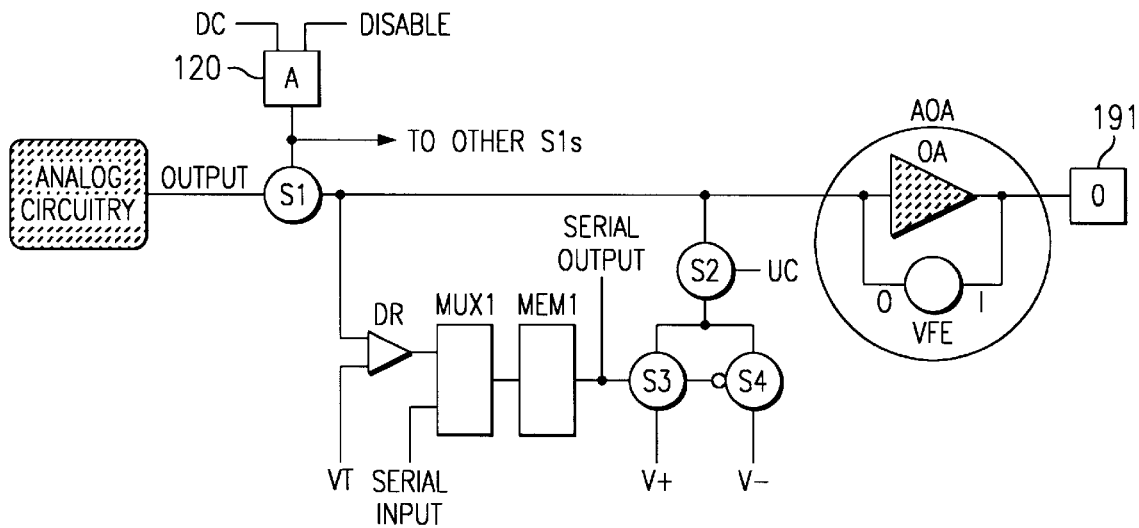
FIG. 24 illustrates a modification to the structure of FIG. 19 to permit safe power up of an IC whose outputs are shorted.

In FIG. 24 a scheme similar to that of FIGS. 12–13 is applied to the analog output of FIG. 19. In FIG. 24, the disable signal is input to AND gate 120 along with DC. The output of the gate is input to the signal path switch S1. At power up, disable can be set to a state that opens S1 regardless of the state of DC. While S1 is open, an Extest can be performed to test the analog output as previously described in regard to the digital output of FIGS. 12 and 13. While S1 is open, VFE provides feedback to adjust the input of the AOA to the voltage present on the output of the AOA. If terminal 191 is shorted to ground or supply, the AOA will adjust to output that voltage level. By repetitively adjusting VT and performing capture and shift operations, the voltage level at the AOA output can be determined as precisely as desired. If AOA is not shorted but rather outputting the selected Extest voltage level, it will continue outputting that voltage level. After testing and, if required, repairing shorts at the terminal 191, the disable signal can be inactivated to permit closing of S1 to allow the OA to be connected to the analog circuitry for functional operation.

Because this method of safely testing analog outputs on newly assembled boards and MCMs is analogous to that previously described for safely testing digital outputs, the disable signal can be the same for both digital and analog outputs of mixed signal ICs. Also the same AND gate 120 can be used to control all digital TG1s (FIGS. 12–13) and analog signal path S1s (FIG. 24).

In some applications it may be preferred not to disable analog and digital outputs until after the IC has powered up and preset its outputs to an initial condition. For example, in dense board designs, containing hundreds of digital, analog, and mixed signal ICs, it may be better to allow all the ICs to power up and output initial conditions on their digital and analog outputs prior to disabling their outputs via the disable signal. The functional design of the board will take into account what conditions should be initially output following power up. For example, a data or signal processor may be functionally designed to avoid output contention on its bi-directional data buses with other ICs (memories, I/O, cache, A/Ds, D/As, other processors, etc.) connected to the bi-directional data buses by tristating its bi-directional output buffers. Also, analog and mixed signal ICs may be functionally designed to output an initial voltage from analog outputs after power up, for example to: establish a power supply level, set a voltage threshold or reference level, or to allow a complex analog amplifier or filter circuit comprising multiple interconnected ICs to settle to quiescent condition.

The power up sequences may be: (1) simple such as waiting until the IC outputs are initialized to a first output condition, or (2) more complex by extending beyond simply setting the outputs to a first condition and including say a processor executing a power up self test or initialization code sequence. If a processor executes a self test, it may test itself and then perform I/O to test other ICs on the board. If a processor executes an initialization code sequence, it may simply initialize itself and then perform I/O to initialize other ICs on the board. By delaying the activation of the disable signal of FIGS. 12, 13, and 24, digital and analog outputs can either be disabled after the IC outputs have been set to a first output condition, or disabled after the IC has executed a self test or initialization sequence. If the disable signal were activated at power up, the IC would not be able to establish even a first output condition since the digital and analog outputs would be isolated (by TG1 and S1) from the digital or analog core circuitry. In some types of ICs (simple ICs such as buffers, decoders and registers) immediate activation of the disable signal may be acceptable. However, in other types of ICs (complex code driven ICs such as data or signal processors) it may be advantageous to delay activation of the disable signal until after power up sequences such as those described above have occurred. When activated, the disable signal will permit the LOBs/AOAs to relieve any undesirable voltage contention at the IC outputs.

The previously described method of safely powering up ICs or die on a newly assembled board or other substrate using the disable signal provides a way to make output circuits (digital output buffers and analog output amplifiers) self correct to safe conditions in the presence of shorts to supply or ground or shorts between outputs (See FIGS. 12, 13, and 24). While this method provides improvement in protecting outputs compared to the prior art, nevertheless contention exists for a brief moment in time when the outputs are performing the self correction operation. If the output circuit is strong, significant current can flow into or out of the output prior to the self correction. Also, if two equally strong outputs are in contention with one another there exists the possibility that neither will win a voltage contention contest and thus they may remain in a state of contention until appropriate scan operations are performed.

Figure 25:
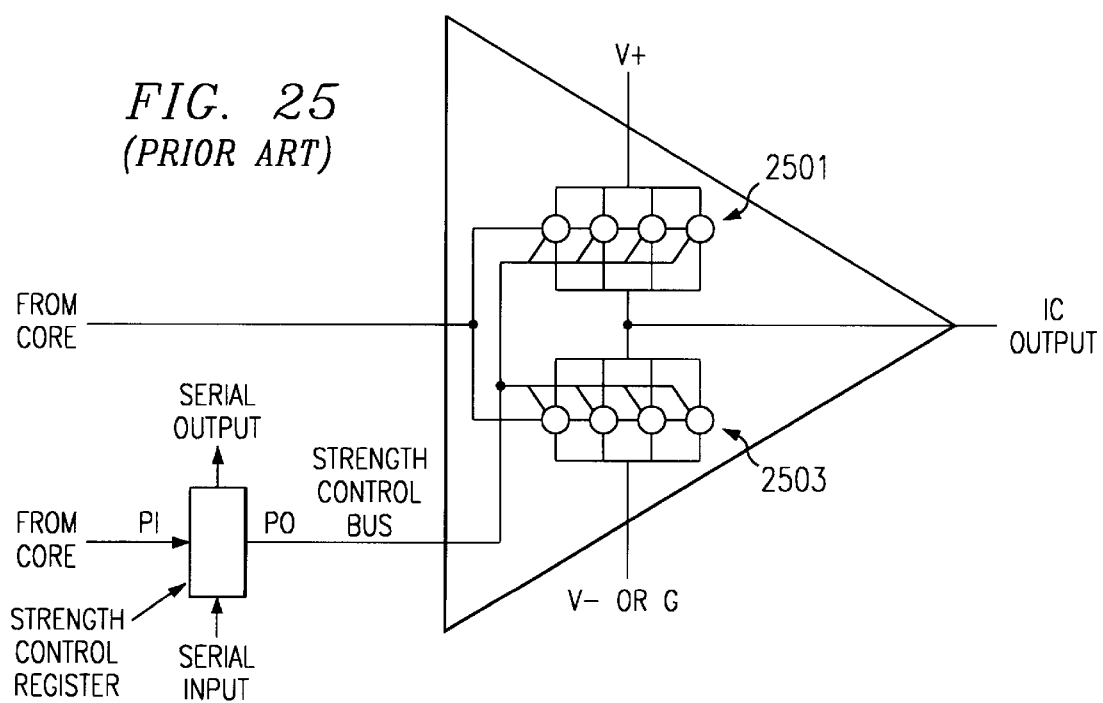
FIG. 25 illustrates a prior art output circuit with programmable drive strength.

FIG. 25 illustrates a prior art example of an output drive circuit such as a digital output buffer or analog output amplifier whose drive strength is programmable via a strength control bus from a strength control register in the functional core circuitry of the IC. Signal lines in the strength control bus are routed to individual transistors in the output drive circuit. This arrangement allows the V+ drive to be adjusted by enabling or disabling ones of the four transistors 2501 coupled between V+ and the IC output to produce 1×, 2×, 3×, or 4×drive capability. Likewise, the V− sink can be adjusted by enabling or disabling ones of the four transistors 2503 coupled between V− and the IC output to produce 1×, 2×, 3×, or 4×sink capability. This type of output circuitry provides a method of programming the drive strength of output buffers to meet an applications power and performance goal. While a single output circuit is shown receiving strength control input, a group of output circuits forming an output bus could be commonly connected to the strength control bus so that all could be programmed to the same strength levels. Also, while the example in FIG. 25 shows four transistors between the IC output and V+ and V−, any number could be used to provide further strength adjustment.

The strength control register has a parallel input (PI) from the core to allow loading strength control commands in parallel, and also has a parallel output (PO) connected to the strength control bus. The strength control register also has a serial input (SI) and a serial output (SO) so that strength control commands may be loaded by serial scan operations if desired.

Figure 26:
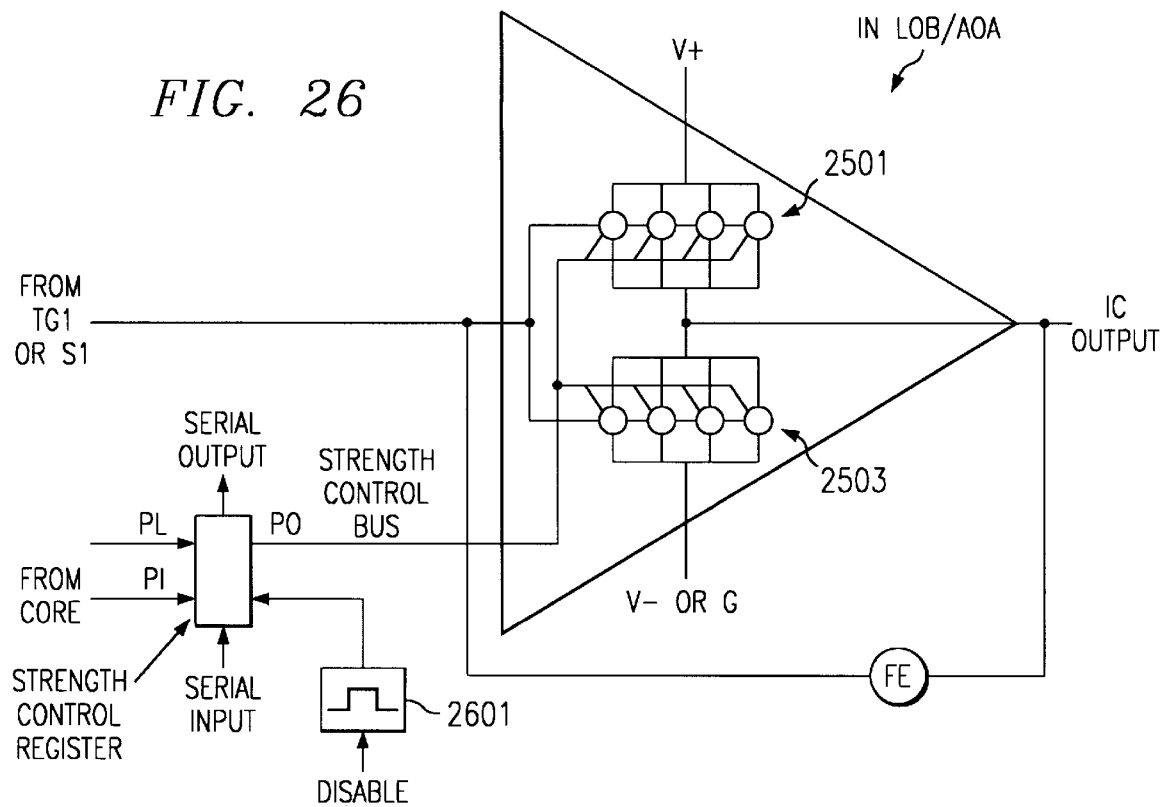
FIG. 26 illustrates use of the disable signal of FIGS. 12 and 24 to select the drive strength of the LOB of FIG. 4 or the AOA of FIG. 19.

FIG. 26 illustrates that the disable signal of FIGS. 12, 13, and 24 can be input to the strength control register(s) to initialize or preload the register(s) with a predetermined preload command PL that forces the output circuit directly to, for example, its minimum strength level (1×) during initial testing of a newly assembled circuit board or MCM. When disable goes active low, the falling edge thereof triggers pulse generator 2601 to output a pulse that causes PL to be preloaded into the strength register. The testing would be the same as previously described in FIGS. 12, 13, and 24 for both digital and analog outputs. The only addition to the test would be use of the disable signal for immediate preloading of the strength control register(s) to force the output circuits into a low strength mode. In this FIG. 26 example, the severity of the two problems mentioned above, i.e. (1) the momentary high current surge before self correction occurs, and (2) the possibility of equal strength outputs remaining in a state of contention, is reduced to a point where minimum damage or degradation of output circuits will occur. During tests, and while the disable signal remains active, SI and SO can be used to scan strength control commands into the strength control register in order to adjust the output strength of the output drive circuit. This may be required, for example, to enable an output circuit to drive a test signal to an external load that cannot be adequately driven by the initial minimum strength control setting that was preloaded into the strength control register by the disable signal. Also, if PL is used to turn off all transistors 2501 and 2503, then a suitable command can be scan loaded to turn on the output circuit for test operations. After testing and removal of the disable signal, the IC can enter its normal mode of operation wherein the output strength can be adjusted as required by writing from the core to the strength control register(s).

The feedback element FE in FIG. 26 represents either the latch buffer (see FIG. 4) of a digital output or the VFE (see FIG. 19) of an analog output.

Although exemplary embodiments of the present invention are described above, this description does not limit the scope of the invention, which can be practiced in a variety of embodiments.

What is claimed is:

1. A method of operating an integrated circuit having functional circuitry for performing normal operating functions of the integrated circuit and output circuits for receiving output signals from the functional circuitry and driving the output signals to output terminals of the integrated circuit, comprising the steps of:

powering up the integrated circuit with the output circuits disconnected from the functional circuitry;

inputting a test signal to the output circuits and thereafter observing whether an expected response to the test signal occurs at the output terminals;

setting a drive strength of one of the output circuits to a drive strength level that is less than a fill drive strength level thereof; and connecting the output circuits to the functional circuitry only if the expected response is observed.

2. The method of claim 1, wherein one of the output signals is a digital signal.

3. The method of claim 1, wherein one of the output signals is an analog signal.

4. The method of claim 1, wherein one of the output signals is a digital signal and another of the output signals is an analog signal.

5. The method of claim 1, including using a disable signal to open switches that are respectively connected between the output circuits and the functional circuitry.

6. The method of claim 1, wherein said inputting step includes scanning test data into the integrated circuit.

7. The method of claim 1, wherein said observing step includes scanning test data out of the integrated circuit.

8. The method of claim 1, including, before said connecting step, resolving voltage contention at one of the output terminals.

9. The method of claim 1, including repairing a short circuit at one of the output terminals if the expected response is not observed.

10. The method of claim 9, including, after said repairing step, connecting the functional circuitry to the output circuits.

11. The method of claim 5, including using the disable signal to set the drive strength of the one output circuit.

12. A method of operating an integrated circuit having functional circuitry for performing normal operating functions of the integrated circuit and having output circuits which include respective inputs for receiving output signals from the functional circuitry and which output circuits drive the output signals to output terminals of the integrated circuit, comprising the steps of:

powering up the integrated circuit with the output circuits disconnected from the functional circuitry but with the output circuits still capable of driving to the output terminals signals received at the inputs;

inputting a test signal to the inputs of the output circuits and thereafter observing whether an expected response to the test signal occurs at the output terminals; and connecting the output circuits to the functional circuitry only if the expected response is observed.

13. The method of claim 12, wherein one of the output signals is a digital.

14. The method of claim 12, wherein one of the output signals is an analog signal.

15. The method of claim 12, wherein one of the output signals is a digital signal and another of the output signals is an analog signal.

16. The method of claim 12, including, before said connecting step, setting a drive strength of one of the output circuits to a drive strength level that is less than a fill drive strength level thereof.

17. The method of claim 12, including using a disable signal to open switches that are respectively connected between the output circuits and the functional circuitry.

18. The method of claim 17, including, before said connecting step, using the disable signal to set a drive strength of the output circuits to a drive strength level that is less than a full drive strength level thereof.

19. The method of claim 12, wherein said inputting step includes scanning test data into the integrated circuit.

20. The method of claim 12, wherein said observing step includes scanning test data out of the integrated circuit.

21. The method of claim 12, including, before said connecting step, resolving voltage contention at one of the output terminals.

22. The method of claim 12, including repairing a short circuit at one of the output terminals if the expected response is not observed.

23. The method of claim 22, including, after said repairing step, connecting the functional circuitry to the output circuits.

24. A method of operating an integrated circuit having functional circuitry for performing normal operating functions of the integrated circuit and having output circuits which include respective inputs for receiving output signals from the functional circuitry and which output circuits drive the output signals to output terminals of the integrated circuit, comprising the steps of:

powering up the integrated circuit with the output circuits disconnected from the functional circuitry but with the output circuits still capable of driving to the output terminals signals received at the inputs; and inputting a test signal, to the inputs of the output circuits and thereafter observing whether an expected response to the test signal occurs at the output terminals.

* * * * *